United States Patent
Kim et al.

(10) Patent No.: US 9,627,997 B2
(45) Date of Patent: Apr. 18, 2017

(54) POWER GENERATING SYSTEM

(75) Inventors: Yoonho Kim, Shiga (JP); Juyoung Kim, Shiga (JP); Satoru Yamanaka, Shiga (JP); Takeshi Serizawa, Shiga (JP); Hirohisa Tanaka, Shiga (JP); Tadachika Nakayama, Niigata (JP); Masatoshi Takeda, Niigata (JP); Noboru Yamada, Niigata (JP); Koichi Niihara, Niigata (JP)

(73) Assignees: DAIHATU MOTOR CO., LTD, Osaka (JP); NATIONAL UNIVERSITY COORORATION NAGAOKA UNIVERSITY OF TECHNOLOGY, Niigata (JP)

( * ) Notice: Subject to any disclaimer, the term of this patent is extended or adjusted under 35 U.S.C. 154(b) by 514 days.

(21) Appl. No.: 14/347,115

(22) PCT Filed: Aug. 28, 2012

(86) PCT No.: PCT/JP2012/071711
§ 371 (c)(1),
(2), (4) Date: Mar. 25, 2014

(87) PCT Pub. No.: WO2013/047057
PCT Pub. Date: Apr. 4, 2013

(65) Prior Publication Data
US 2014/0225474 A1 Aug. 14, 2014

(30) Foreign Application Priority Data

Sep. 28, 2011 (JP) ................ 2011-212680
Sep. 28, 2011 (JP) ................ 2011-212681
Jun. 29, 2012 (JP) ................ 2012-147731

(51) Int. Cl.
*H02N 2/18* (2006.01)
*H01L 41/08* (2006.01)
(Continued)

(52) U.S. Cl.
CPC .......... *H02N 11/002* (2013.01); *F01N 5/025* (2013.01); *H01L 37/02* (2013.01); *H01L 41/113* (2013.01); *Y02T 10/16* (2013.01)

(58) Field of Classification Search
CPC .................. H02N 2/18; H02N 2/186
(Continued)

(56) References Cited

U.S. PATENT DOCUMENTS 3,198,969 A * 8/1965 Kolm ............... H01L 37/02
                                                        136/205
5,644,184 A * 7/1997 Kucherov ............. F25B 21/00
                                                        310/306

(Continued)

FOREIGN PATENT DOCUMENTS

FR          3013509 A1 * 11/2013 ............ H01L 37/00
JP          59-108818 A    6/1984
(Continued)

OTHER PUBLICATIONS

International Search Report Issued in PCT/JP2012/071711 on Dec. 4, 2012.
(Continued)

*Primary Examiner* — Thomas Dougherty
(74) *Attorney, Agent, or Firm* — Jean C. Edwards; Edwards Neils LLC

(57) ABSTRACT

A power-generating system includes a heat source which is able to produce temporal temperature variation, a first device in which polarization occurs based on the temperature change of the heat source, and a second device for taking out a net generating power from the first device, wherein 80% or higher of the total surface area of the first device is heated and/or cooled with the heat source.

9 Claims, 16 Drawing Sheets

(51) Int. Cl.
*H02N 11/00* (2006.01)
*H01L 37/02* (2006.01)
*F01N 5/02* (2006.01)
*H01L 41/113* (2006.01)

(58) Field of Classification Search
USPC .......................................................... 310/339
See application file for complete search history.

(56) References Cited

U.S. PATENT DOCUMENTS

| | | | |
|---|---|---|---|
| 7,479,727 B1* | 1/2009 | Grace | H01L 37/02 310/306 |
| 8,492,958 B2* | 7/2013 | Skotnicki | H02N 2/18 310/307 |
| 8,773,003 B2* | 7/2014 | Skotnicki | H02N 2/18 310/306 |
| 9,190,597 B2 | 11/2015 | Kim et al. | |
| 2004/0251690 A1 | 12/2004 | Chen et al. | |
| 2005/0205125 A1* | 9/2005 | Nersessian | H02N 2/18 136/205 |
| 2010/0175392 A1* | 7/2010 | Malloy | F25B 21/00 62/3.2 |
| 2011/0095655 A1* | 4/2011 | Skotnicki | H02N 2/18 310/339 |
| 2013/0002091 A1 | 1/2013 | Kim et al. | |
| 2013/0099121 A1 | 4/2013 | Kawano et al. | |

FOREIGN PATENT DOCUMENTS

| | | |
|---|---|---|
| JP | 03-177082 A | 8/1991 |
| JP | 11-257064 A | 9/1999 |
| JP | 11-332266 A | 11/1999 |
| JP | 2000-073754 A | 3/2000 |
| JP | 2007-288923 A | 11/2007 |
| WO | 2011/111099 A1 | 9/2011 |
| WO | WO 2011/135970 A1 | 11/2011 |

OTHER PUBLICATIONS

European Search Report issued by the European Patent Office (EPO) on Apr. 9, 2015 in connection with European Patent Application No. 12835162.4.

International Preliminary Report on Patentability issued by WIPO on Apr. 10, 2014 in connection with International Application No. PCT/JP2012/071711.

* cited by examiner

FIG. 4
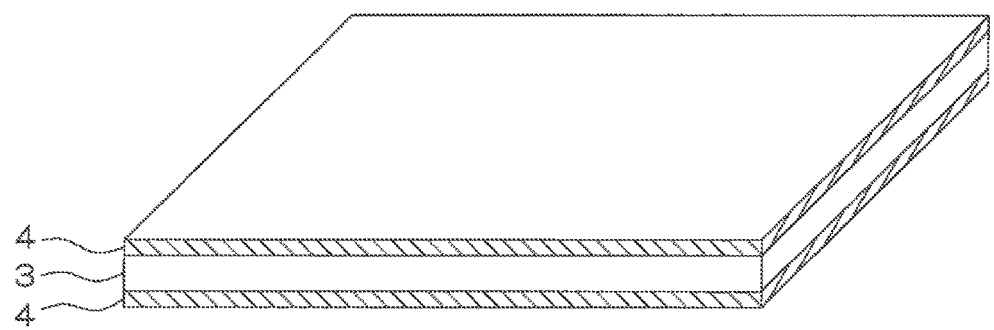
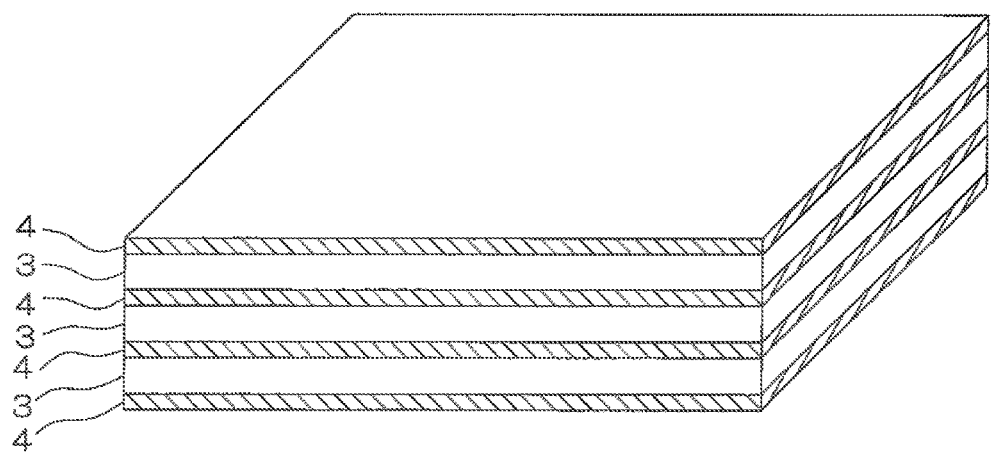

FIG. 6
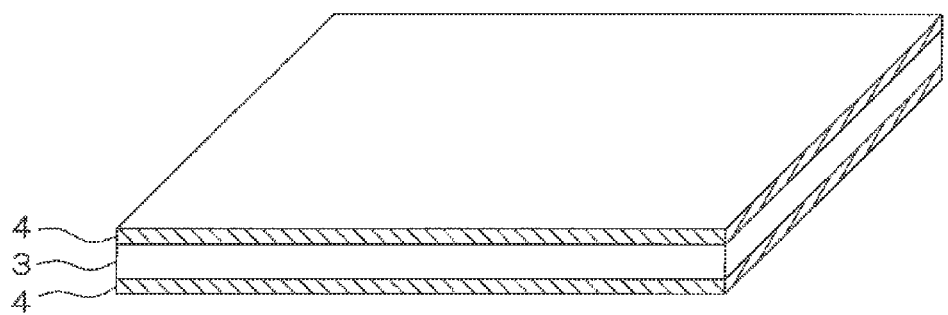
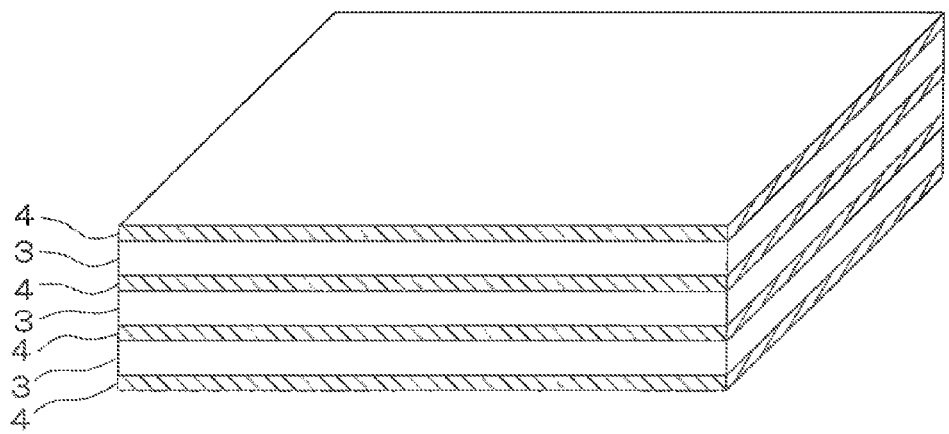
21

POWER GENERATING SYSTEM

CROSS-REFERENCE TO RELATED APPLICATIONS

The present invention is a 35 U.S.C. 371 National Stage Entry of PCT/JP2012/071711, filed Aug. 28, 2012, which claims priority from Japanese Patent Application Nos. 2011-212680, filed on Sep. 28, 2011, 2011-212681, filed on Sep. 28, 2011, and 2012-147731, filed on Jun. 29, 2012, the contents of all of which are herein incorporated by reference in their entirety.

TECHNICAL FIELD

The present invention relates to a power-generating system.

BACKGROUND ART

Conventionally, a large amount of heat energy is released and lost as, for example, waste heat, light, etc. in various energy-using devices such as internal combustion engines including an automobile engine; heat exchangers including a boiler and air-conditioning equipment; motor generators including a power generator and a motor; and luminous devices including lightings.

Nowadays, recovery and recycling of released heat energy as an energy source has been required in view of energy conservation, and as such a method, a thermoelectric generation in which a pyroelectric element is used is known.

To be specific, for example, Patent Document 1 below has proposed a method using a power-generating apparatus including a rotating body, a plurality of pyroelectric elements attached to the outer peripheral surface of the rotating body, and a heating tub and a cooling tub that increase and decrease the temperature of the pyroelectric element based on the rotational driving of the rotating body; and by increasing and decreasing the temperature of the pyroelectric elements by the heat source and cooling source periodically, direct-current power or alternating-current power is taken out from the pyroelectric element.

CITATION LIST

Patent Document

Patent Document 1
Japanese Unexamined Patent Publication No. H11-332266

SUMMARY OF THE INVENTION

Problem to be Solved by the Invention

Meanwhile, such a power-generating method requires power generation with more excellent efficiency.

An object of the present invention is to provide a power-generating system capable of more excellently efficient generation of electricity.

Means for Solving the Problem

To achieve the above object, a power-generating system of the present invention includes
a heat source which is able to produce temporal temperature variation,
a first device in which polarization occurs based on the temperature change of the heat source, and
a second device for taking out a net generating power from the first device,
wherein 80% or higher of the total surface area of the first device is heated and/or cooled by the heat source.

In the power-generating system of the present invention, it is preferable that the first device is a sheet, and both of the front face and the reverse face of the first device are heated and/or cooled by the heat source.

In the power-generating system of the present invention, it is preferable that the first device undergoes polarization by the piezoelectric effect.

In the power-generating system of the present invention, it is preferable that the first device undergoes polarization by the pyroelectric effect.

A power-generating system of the present invention includes
a heat source which is able to produce temporal temperature variation,
a plurality of first devices in which polarization occurs based on the temperature change of the heat source, and
a plurality of second devices for taking out a net generating power from the first device,
wherein the first device and the second device are alternately layered.

In the power-generating system of the present invention, it is preferable that the heat source is an internal combustion engine.

In the power-generating system of the present invention, it is preferable that the first device undergoes polarization by the piezoelectric effect.

In the power-generating system of the present invention, it is preferable that the first device undergoes polarization by the pyroelectric effect.

A power-generating system of the present invention includes
a heat source which is able to produce temporal temperature variation,
a first device which is able to produce temporal temperature variation based on the temperature change of the heat source and in which polarization occurs, and
a second device for taking out a net generating power from the first device,
wherein the second device includes a first electrode and a second electrode having different polarities from each other,
the first electrode includes two outer electrodes that are disposed to face each other so as to sandwich the first device from outside and are electrically connected to each other, and
the second electrode includes an inner electrode disposed between the two outer electrodes in the first device.

In the power-generating system of the present invention, it is preferable that the first electrode further includes at least one inner electrode electrically connected to the outer electrode and disposed in the first device between the two outer electrodes; the second electrode includes a plurality of inner electrodes that are electrically connected to each other; and in the first device, the inner electrode of the first electrode and the inner electrodes of the second electrode are alternately disposed.

Effects of the Invention

With the power-generating system of the present invention, power generation efficiency can be improved.

BRIEF DESCRIPTION OF THE DRAWINGS

FIG. 4 is a schematic diagram illustrating the configuration of another embodiment of the first device shown in FIG. 3.

FIG. 6 is an enlarged schematic diagram illustrating the configuration of the second embodiment of the first device and the second device used in the power-generating system of the present invention.

EMBODIMENT OF THE INVENTION

First Embodiment

In the following, a first embodiment of the present invention is described.

Figure 1:
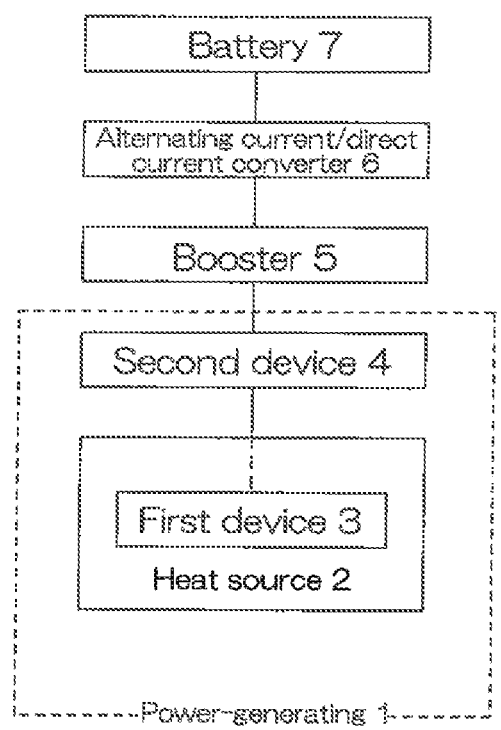
FIG. 1 is a schematic diagram illustrating the configuration of a first embodiment of the power-generating system of the present invention.

FIG. 1 is a schematic diagram illustrating the configuration of a first embodiment of the power-generating system of the present invention.

In FIG. 1, a power-generating system 1 includes a heat source 2 having a temporal temperature variation; a first device 3 that undergoes polarization due to a temperature change of the heat source 2; and a second device 4 that takes out a net generating power from the first device 3.

The heat source 2 is not particularly limited, as long as the heat source has a temporal temperature variation, and examples thereof include various energy-using devices such as internal combustion engines, and luminous devices.

The internal combustion engine is, for example, a device that outputs motive power for vehicles. For example, a single cylinder or a multicylinder type is used, and in the single cylinder or multicylinder, a multi-stroke cycle (e.g., two-stroke cycle, four-stroke cycle, and six-stroke cycle, etc.) is used.

In such an internal combustion engine, pistons repeatedly move up and down in the cylinders, and such up-down moves of the pistons allow, for example, in the four-stroke cycle system, performance of an intake stroke, a compression stroke, a power stroke, and an exhaust stroke sequentially, and combustion of fuel, to output motive power.

In such an internal combustion engine, in the exhaust stroke, a high temperature exhaust gas is discharged via the exhaust gas pipe. The heat energy is conducted with the exhaust gas as a heating medium, and the internal temperature of the exhaust gas pipe increases.

Meanwhile, in other strokes (strokes excluding the exhaust stroke), the exhaust gas amount in the exhaust gas pipe decreases, and therefore the internal temperature of the exhaust gas pipe decreases compared with the exhaust stroke.

Thus, the temperature of the internal combustion engine increases in the exhaust stroke, decreases in the intake stroke, compression stroke, and power stroke: that is, the temperature temporally varies.

In particular, the above-described strokes are repeated periodically and sequentially in accordance with the piston cycle, and therefore the internal temperature of the exhaust gas pipes of the cylinders of the internal combustion engine changes periodically in accordance with the cycle of the repetition of the above-described strokes, to be more specific, a high-temperature state and a low-temperature state are repeated periodically.

The temperature of the luminous device increases when the luminous device is turned on (emission), for example, by heat energy of light such as infrared radiation and visible light as a heating medium, while when the luminous device is turned off, its temperature decreases. Thus, the temperature of the luminous devices temporally varies when turned on (emission) or off over time.

In particular, for example, when the luminous device is a luminous device that repeats turning on and off of light over time intermittently (blinking (switching) luminous device), the temperature of the luminous device changes periodically by heat energy of light at the time when turned on (emission), to be more specific, a high-temperature state and a low-temperature state are repeated periodically.

Examples of the heat source 2 further include a plurality of heat sources, and a temperature change can also be caused by switching between the plurality of heat sources.

To be more specific, for example, in an embodiment, the heat source includes two heat sources, i.e., a low temperature heat source (coolant, etc.) and a high temperature heat source (e.g., heating material, etc.) having a temperature higher than the low temperature heat source; and the low temperature heat source and the high temperature heat source are switched back and forth alternately over time.

In this manner, the temperature of the heat source can be increased or decreased over time, and in particular, by repeating the switching back and forth between the low temperature heat source and the high temperature heat source periodically, the periodic temperature change can be achieved.

The heat source 2 including a plurality of switchable heat sources is not particularly limited, and examples thereof include a high temperature air furnace (e.g., a high-temperature gas generator described in WO 96-05474) including a combustion low temperature air supplier, a regenerator heat exchanger, a high temperature gas exhauster, and a supply/exhaust switch valve; and a seawater exchange system (hydrogen storage alloy actuator seawater exchange system) using a high temperature heat source, a low temperature heat source, and a hydrogen storage alloy.

As the heat source 2, the above-described heat sources may be used singly or in combination of two or more.

As the heat source 2, preferably, a heat source that undergoes a temporal temperature variation is used.

As the heat source 2, preferably, an internal combustion engine is used.

The first device 3 is a device that undergoes polarization in accordance with the temperature change of the heat source 2.

The polarization here is defined as the following: a phenomenon of electromotive force occurrence in a material, including, for example, a phenomenon of occurrence of a potential difference by dielectric polarization due to displacement of plus and minus ions based on the deformation of a crystal, such as the piezoelectric effect; and/or a phenomenon of occurrence of a potential difference by changes in the dielectric constant due to a temperature change, such as the pyroelectric effect.

Examples of the first device 3 include, to be more specific, a device that undergoes polarization by the piezoelectric effect, and a device that undergoes polarization by the pyroelectric effect.

In the piezoelectric effect (phenomenon), polarization is caused when a pressure or a deformation is applied in accordance with the degree of the pressure or the deformation.

The first device 3 that undergoes polarization by the piezoelectric effect is not particularly limited, and a known piezoelectric element may be used.

When a piezoelectric element is used as the first device 3, the piezoelectric element is disposed, for example, so that the surrounding thereof is fixed by a fixing component to suppress the volume expansion thereof.

To be specific, the piezoelectric element is disposed so that 80% or higher, preferably 85% or higher, more preferably 90% or higher of the total surface area of the first device 3 is in contact with the heat source 2, or, in contact with (exposed to) a heating medium (the above-described exhaust gas, light, etc.) that conducts the heat of the heat source 2.

When the second device 4 is directly layered onto the first device 3, for example, in the case where the second device 4 to be described later is an electrode formed from, for example, an electrode paste, the first device 3 is disposed so that the first device 3 is in contact with the heat source 2 with the second device 4 interposed therebetween, or, in contact with (exposed to) a heating medium (the above-described exhaust gas, light, etc.) that conducts the heat of the heat source 2 with the second device 4 interposed therebetween (the same applies to the following).

The fixing component is not particularly limited, and for example, the second device 4 (e.g., electrode, etc.) to be described later may also be used.

In such a case, the piezoelectric element is heated or cooled by a temporal temperature variation of the heat source 2, as necessary, through the heating medium, which allows expansion or shrinkage thereof.

In such a case, the volume expansion of the piezoelectric element is suppressed by the fixing component, and therefore the piezoelectric element is pressed by the fixing component, which allows polarization to occur by the piezoelectric effect or phase transformation near the Curie temperature. In this manner, although to be described later, a net generating power is taken out from the piezoelectric element via the second device 4.

In such a piezoelectric element, usually, a heated state or a cooled state is kept, and when its temperature becomes constant (that is, the volume is constant), the polarization is neutralized, and by cooling or heating thereafter, the piezoelectric element undergoes polarization again.

Thus, as described above, when the temperature of the heat source 2 changes periodically, and a high-temperature state and a low-temperature state are periodically repeated, the piezoelectric element is heated and cooled repeatedly and periodically, and therefore polarization and neutralization of the piezoelectric element are periodically repeated.

As a result, a net generating power can be taken out as a periodically changing waveform (e.g., alternating current, pulsating current, etc.) by the second device 4 to be described later.

The pyroelectric effect is, for example, the effects (phenomenon) such as the following: when an insulator (dielectric) is heated or cooled, the insulator undergoes polarization in accordance with the temperature change. The pyroelectric effect includes a first effect and a second effect.

In the first effect, at the time of heating or cooling of the insulator, spontaneous polarization occurs by the temperature change, and an electric charge is generated on the insulator surface.

In the second effect, at the time of heating or cooling of the insulator, pressure deflection is caused in the crystal structure by the temperature change, and the pressure or the deformation on the crystal structure causes piezoelectric polarization (piezoelectric effect).

Such a device that undergoes polarization by the pyroelectric effect is not particularly limited, and a known pyroelectric element may be used.

When the pyroelectric element is used as the first device 3, the pyroelectric element is disposed so that 80% or higher, preferably 85% or higher, more preferably 90% or higher of the total surface area thereof is in contact with the heat source 2, or, in contact with (exposed to) a heating medium (the above-described exhaust gas, light, etc.) that conducts the heat of the heat source 2.

In such a case, the pyroelectric element is heated or cooled by a temporal temperature variation of the heat source 2, as necessary, through the heating medium, and undergoes polarization by its pyroelectric effect (including the first effect and second effect). In this manner, although to be described later, a net generating power is taken out from the pyroelectric element via the second device 4.

In such a pyroelectric element, usually, a heated state or a cooled state is kept, and when its temperature becomes constant, the polarization is neutralized, and by cooling or heating thereafter, the pyroelectric element undergoes polarization again.

Thus, as described above, when the temperature of the heat source 2 changes periodically, and a high-temperature state and a low-temperature state are periodically repeated, the pyroelectric element is heated and cooled periodically and repeatedly, and therefore the polarization and neutralization of the pyroelectric element are periodically repeated.

As a result, a net generating power can be taken out as a periodically changing waveform (e.g., alternating current, pulsating current, etc.) by the second device 4 to be described later.

These first devices 3 may be used singly or in combination of two or more.

Examples of the first device 3 that may be used are, as described above, to be specific, a known pyroelectric element (e.g., $BaTiO_3$, $CaTiO_3$, $(CaBi)TiO_3$, $BaNd_2Ti_5O_{14}$, $BaSm_2Ti_4O_{12}$, lead zirconate titanate ($PZT:Pb(Zr,Ti)O_3$), etc.), and a known piezoelectric element (e.g., crystal ($SiO_2$), zinc oxide (ZnO), Rochelle salt (potassium sodium tartrate) ($KNaC_4H_4O_6$), lead zirconate titanate (PZT: $Pb(Zr,Ti)O_3$), lithium niobate ($LiNbO_3$), lithium tantalate ($LiTaO_3$), lithium tetraborate ($Li_2B_4O_7$), langasite ($La_3Ga_5SiO_{14}$), aluminum nitride (AlN), tourmaline, polyvinylidene fluoride (PVDF), etc.).

The Curie temperature of the first device 3 is, for example, −77° C. or higher, preferably −10° C. or higher, and for example, 1300° C. or lower, preferably 900° C. or lower.

The relative dielectric constant of the first device 3 (insulator (dielectric)) is, for example, 1 or higher, preferably 100 or higher, and even more preferably 2000 or higher.

In such a power-generating system 1, higher the relative dielectric constant of the first device 3 (insulator (dielectric)) is, the higher the energy conversion efficiency is, which allows for obtainment of a net generating power at high voltage. However, when the relative dielectric constant of the first device 3 is below the above-described lower limit, the energy conversion efficiency is low, and the voltage of the obtained net generating power may be low.

In the first device 3 (insulator (dielectric)), polarization occurs by the temperature change of the heat source 2, and the polarization may be any of electronic polarization, ionic polarization, and orientation polarization.

For example, it has been expected that with those materials in which polarization occurs by orientation polarization (e.g., liquid crystal material, etc.), improvement in power generation efficiency can be achieved by changing its molecule structure.

The shape of the first device 3 is not particularly limited, and for example, a thin (sheet), or a bulk (block) first device 3 may be used. Preferably, a thin (sheet) first device 3 is used.

When the first device 3 is formed into a sheet, although to be described in detail later, preferably both sides of the first device 3, i.e., the front face and the reverse face thereof, are heated and/or cooled by the heat source 2.

In FIG. 1, the second device 4 is provided so as to take out a net generating power from the first device 3.

Such a second device 4 is not particularly limited, and includes, for example, two electrodes (e.g., copper electrode, silver electrode, etc.) that are disposed to face each other with the above-described first device 3 sandwiched therebetween, and lead wires to be connected to these electrodes; and is electrically connected to the first device 3.

In a power-generating system 1 shown in FIG. 1, the second device 4 is electrically connected to, in sequence, a booster 5, an alternating current/direct current converter (AC-DC converter) 6, and a battery 7.

To generate electricity by such a power-generating system 1, for example, first, the temperature of the heat source 2 is increased or decreased over time; preferably, the temperature is changed periodically to heat and/or cool 80% or higher, preferably 85% or higher, more preferably 90% or higher of the total surface area of the first device 3 with the heat source 2.

As described above, when the first device 3 is disposed so that 80% or higher, preferably 85% or higher, more preferably 90% or higher of the total surface area of the first device 3 is in contact with the heat source 2, or, in contact with (exposed to) a heating medium (the above-described exhaust gas, light, etc.) that conducts the heat of the heat source 2, by allowing the temperature of the heat source 2 to change over time, as necessary, through the heating medium, 80% or higher, preferably 85% or higher, more preferably 90% or higher of the total surface area of the first device 3 can be heated and/or cooled.

To be more specific, for example, when the first device 3 is formed into a thin (sheet) first device 3, the first device 3 is disposed so that both faces thereof, i.e., the front face and the reverse face thereof, is in contact with the heat source 2, or, in contact with (exposed to) a heating medium (the above-described exhaust gas, light, etc.) that conducts the heat of the heat source 2.

The surface area in total of both of the front face and the reverse face of the sheet first device 3 is, although it also depends on the thickness of the first device 3, 80% or higher, preferably 85% or higher, more preferably 90% or higher relative to the total surface area of the first device 3.

Thus, by disposing the sheet first device 3 in such a manner, both of the front face and the reverse face, that is, 80% or higher, preferably 85% or higher, more preferably 90% or higher of the total surface area can be heated and/or cooled.

In accordance with such a temperature change, polarization is caused preferably periodically in the above-described first device 3. Thereafter, through the second device 4, a net generating power is taken out as a periodically changing waveform (e.g., alternating current, pulsating current, etc.) in accordance with the periodical polarization of the first device 3.

In such a power-generating system 1, the temperature of the heat source 2 is, in a high-temperature state, for example, 200 to 1200° C., preferably 700 to 900° C.; in a low-temperature state, below the temperature of the above-described high-temperature state, to be more specific, for example, 100 to 800° C., preferably 200 to 500° C.; and the temperature difference between the high-temperature state and the low-temperature state is, for example, 10 to 600° C., preferably 20 to 500° C.

The repetition cycle of the high-temperature state and low-temperature state is, for example, 10 to 400 cycles/sec, preferably 30 to 100 cycles/sec.

The net generating power thus taken out from the power-generating system 1 is boosted in the booster 5 connected to the second device 4, as in a state of a periodically changing waveform (e.g., alternating current, pulsating current, etc.). For the booster 5, a booster that is capable of boosting the alternating current voltage with excellent efficiency with a simple structure using, for example, a coil, condenser, etc is used.

Then, the net generating power with its voltage boosted by the booster 5 is converted to a direct current voltage in the alternating current/direct current converter 6, and thereafter, stored in the battery 7.

With such a power-generating system 1, the heat source 2 having a temporal temperature variation is used, and therefore a changing voltage (e.g., alternating current voltage) can be taken out, and as a result, compared with the case where a constant voltage (direct current voltage) is taken out, net generating power can be stored with a simple structure and excellent boosting efficiency.

Furthermore, when the heat source 2 is a heat source that undergoes a periodic temperature change, the net generating power can be taken out as a periodically changing waveform, and as a result, the net generating power can be stored with a simple structure and excellent boosting efficiency.

With such a power-generating system 1, power generation efficiency can be improved.

Thus, in such a power-generating system 1, 80% or higher of the total surface area of the first device 3 is heated and/or cooled by the heat source 2, and excellently efficient power generation can be achieved.

Furthermore, by using a sheet first device 3, and by heating and/or cooling both of the front face and the reverse face thereof with the heat source 2, 80% or higher of the total surface area of the first device 3 can be heated and/or cooled easily, and excellently efficient power generation can be achieved.

Figure 2:
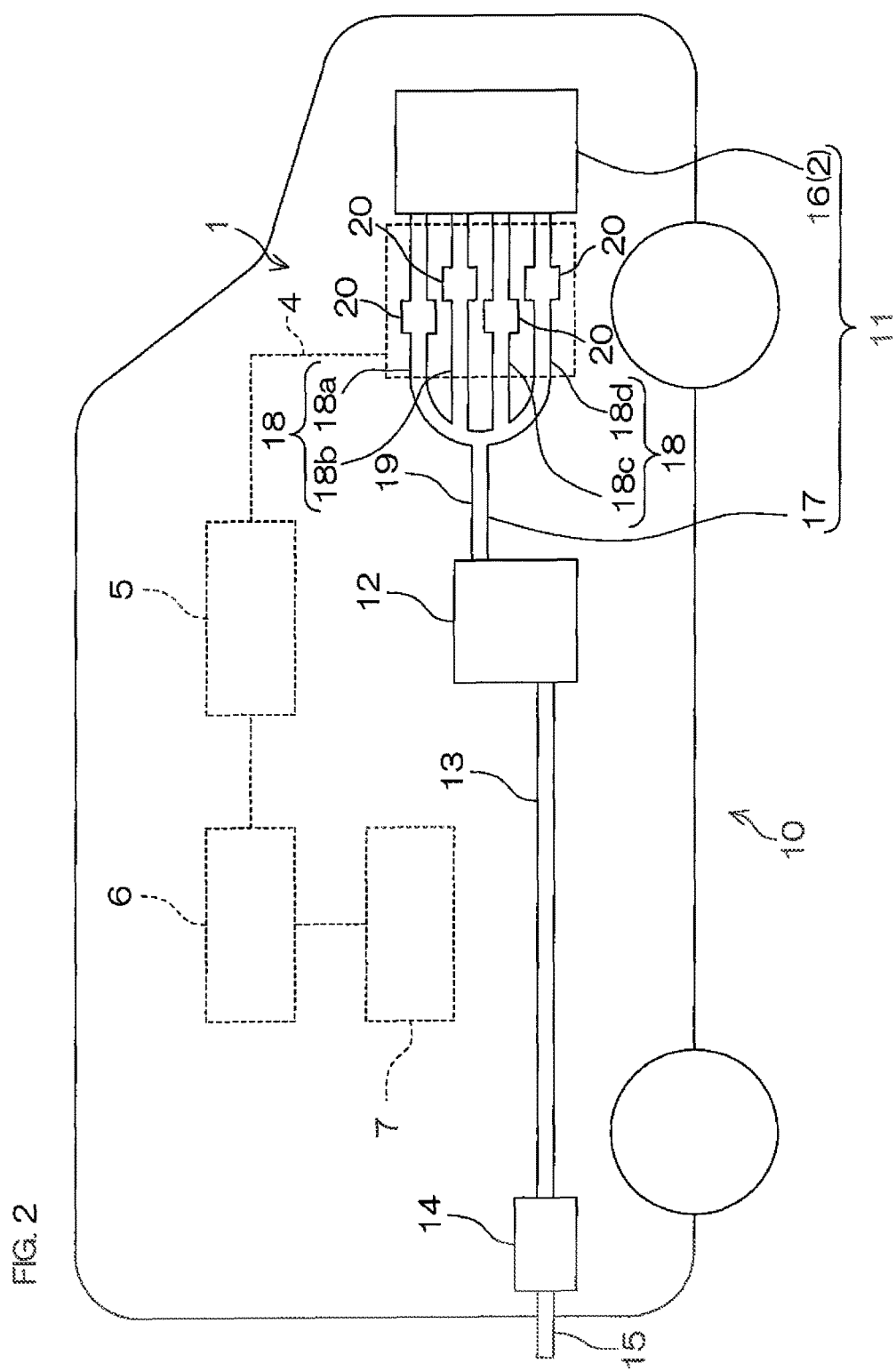
FIG. 2 is a schematic diagram illustrating the configuration of the first embodiment of the power-generating system of the present invention on board.
Figure 3:
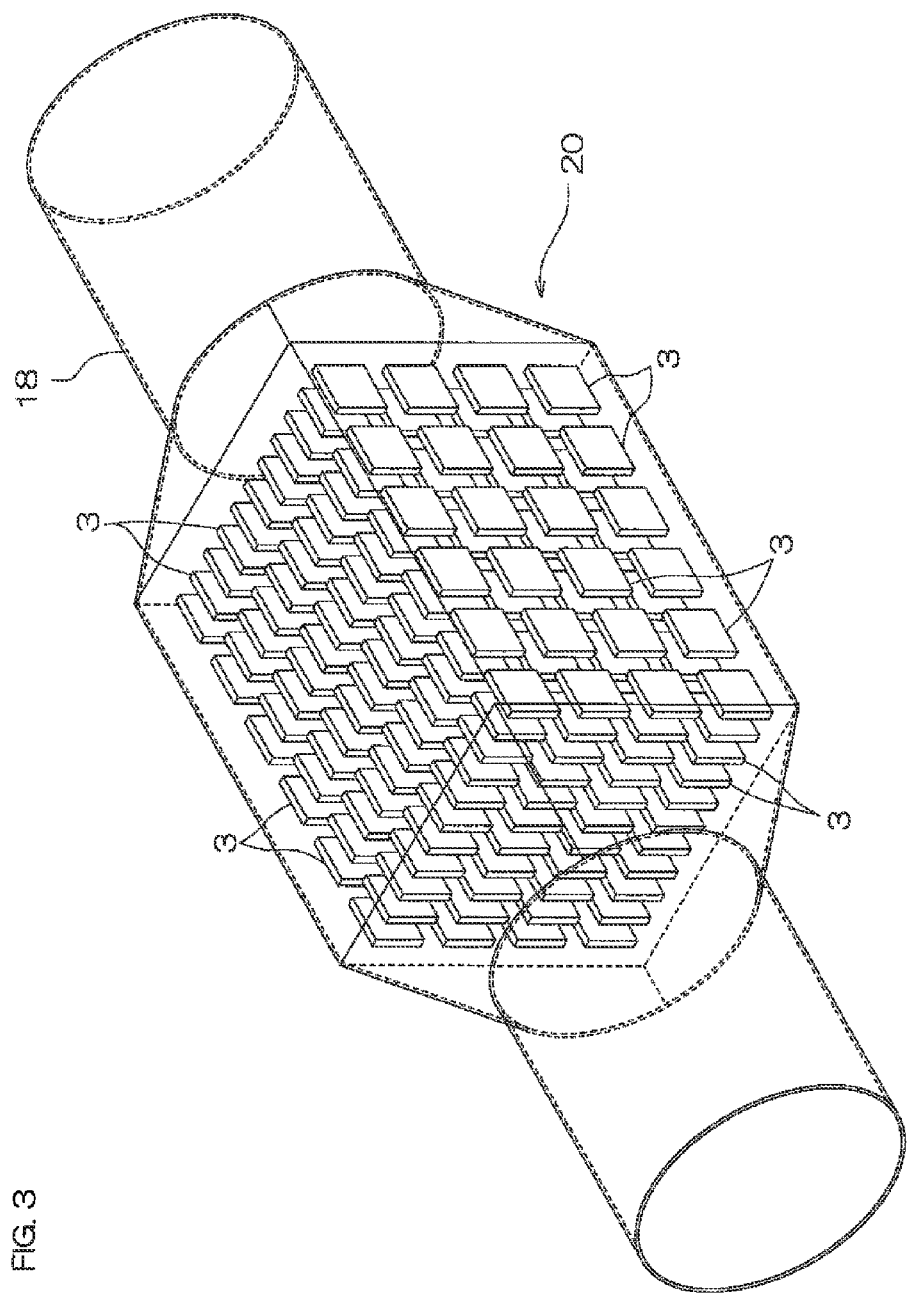
FIG. 3 is an enlarged view of a relevant part of the power-generating system shown in FIG. 2.

FIG. 2 is a schematic diagram illustrating the configuration of a first embodiment of a power-generating system of the present invention on board, and FIG. 3 is an enlarged view of a relevant part of the power-generating system shown in FIG. 2.

In FIG. 2, an automobile 10 includes an internal combustion engine 11, a catalyst mount portion 12, an exhaust pipe 13, a muffler 14, and an outlet pipe 15.

The internal combustion engine 11 includes an engine 16, and an exhaust manifold 17.

The engine 16 is a multicylinder (four cylinder), multi-stroke cycle (four-stroke cycle) engine, and upstream end portions of branch pipes 18 (described later) of the exhaust manifold 17 are connected to the cylinders.

The exhaust manifold 17 is provided for collecting the exhaust gas discharged from the cylinders of the engine 16; and includes a plurality of (four) branch pipes 18 (when these have to be distinguished, these are referred to as, from the top in FIG. 2, a branch pipe 18a, a branch pipe 18b, a branch pipe 18c, and a branch pipe 18d) connected to the cylinders of the engine 16, and a collection pipe 19 that integrates the branch pipes 18 at a downstream side of the branch pipe 18.

Each of the branch pipes 18 includes one box space 20 on its way in the flow direction. The box space 20 is a substantially rectangular parallelepiped space intervened and communicating with the branch pipe 18, and inside therein, includes a plurality of first devices 3, and the second devices 4, which are not shown (ref: FIG. 3).

In such an exhaust manifold 17, the upstream end portions of the branch pipes 18 are connected to the cylinders of the engine 16, and the downstream end portions of the branch pipes 18 are connected to the upstream end portion of the collection pipe 19. The downstream end portion of the collection pipe 19 is connected to the upstream end portion of the catalyst mount portion 12.

The catalyst mount portion 12 includes, for example, a catalyst carrier and a catalyst coated thereon, and is connected to the downstream end portion of the internal combustion engine 11 (exhaust manifold 17) to purify toxic components such as hydrocarbon (HC), nitrogen oxide ($NO_x$), and carbon monoxide (CO) contained in the exhaust gas discharged from the internal combustion engine 11.

The exhaust pipe 13 is provided for guiding the exhaust gas purified at the catalyst mount portion 12 to the muffler 14, and the upstream end portion thereof is connected to the catalyst mount portion 12, and the downstream end portion thereof is connected to the muffler 14.

The muffler 14 is provided to reduce the noise generated in the engine 16 (in particular, power stroke), and the upstream end portion thereof is connected to the downstream end portion of the exhaust pipe 13. The downstream end portion of the muffler 14 is connected to the upstream end portion of the outlet pipe 15.

The outlet pipe 15 is provided for releasing, into the air, the exhaust gas that was discharged from the engine 16, and was purified, with its noise reduced passing through the exhaust manifold 17, the catalyst mount portion 12, the exhaust pipe 13, and the muffler 14 sequentially. The upstream end portion of the outlet pipe 15 is connected to the downstream end portion of the muffler 14, and the downstream end portion of the outlet pipe 15 is open into the air.

The automobile 10 is equipped with, as shown by the dotted line in FIG. 2, the power-generating system 1.

The power-generating system 1 includes, as described above, a heat source 2, a first device 3 (ref: FIG. 3), and a second device 4.

In the power-generating system 1, an engine 16 of the internal combustion engine 11 is used as the heat source 2, and as shown in FIG. 3, first devices 3 are disposed in a box space 20 of the branch pipe 18.

The first devices 3 are formed into a sheet, and in the box space 20, the first devices 3 are arranged in line with a space provided from each other, and are fixed by the second device 4 (or by a fixing component provided as necessary (not shown)), which are not shown.

In this manner, the both sides of the first device 3, i.e., the front face and the reverse face, and furthermore, the peripheral side faces are exposed to the air inside the box space 20 via the second device 4, which are not shown, so that they can be in contact with (exposed to) the exhaust gas.

The second device 4 includes, although not shown, two electrodes that are disposed to face each other with the first device 3 interposed therebetween, and lead wires to be connected to these electrodes.

As shown in FIG. 2, the power-generating system 1 is electrically connected, in sequence, to the booster 5, the alternating current/direct current converter 6, and the battery 7.

In such an automobile 10, the engine 16 is driven by repetitive up-down motion of pistons in cylinders, performing the intake stroke, the compression stroke, the power stroke, and the exhaust stroke in sequence, thereby increasing and decreasing the temperature thereof over time.

To be more specific, for example, in the two cylinders of the cylinder connected to the branch pipe 18a and the cylinder connected to the branch pipe 18c, the pistons work together to conduct the intake stroke, the compression stroke, the power stroke, and the exhaust stroke synchronously. This allows fuel combustion and output of motive power, allowing a high temperature exhaust gas to pass through inside of the branch pipe 18a and the branch pipe 18c in the exhaust stroke.

At this time, the heat of the engine 16 is conducted through the exhaust gas (heating medium); and the internal temperature of the branch pipe 18a and the branch pipe 18c increases in the exhaust stroke and decreases in other strokes (intake stroke, compression stroke, and power stroke), and therefore increases and decreases over time in accordance with the piston cycle, thus repeating a high-temperature state and a low-temperature state periodically.

On the other hand, at different timing from these two cylinders, in the two cylinders of the cylinder connected to the branch pipe 18b and the cylinder connected to the branch pipe 18d, pistons work together to conduct the intake stroke, the compression stroke, the power stroke, and the exhaust stroke synchronously. This allows fuel combustion and output of motive power at different timing from the branch pipe 18*a* and the branch pipe 18*c*, allowing a high temperature exhaust gas to pass through inside of the branch pipe 18*b* and the branch pipe 18*d* in the exhaust stroke.

At this time, the heat of the engine 16 is conducted through the exhaust gas (heating medium), the internal temperature of the branch pipe 18*b* and the branch pipe 18*d* increases in the exhaust stroke, and decreases in other strokes (intake stroke, compression stroke, and power stroke), and therefore increases and decreases over time in accordance with the piston cycle, thus repeating a high-temperature state and a low-temperature state periodically.

The periodic temperature change occurs at the same period, but at a different phase from the periodic temperature change of the branch pipe 18*a* and the branch pipe 18*c*.

In the power-generating system 1, as described above, a sheet first device 3 is disposed inside each of the branch pipes 18 (in the box spaces 20).

Thus, when the exhaust gas discharged from the engine 16 (heat source 2) is introduced into the branch pipes 18 and the box space 20 is filled with the exhaust gas, in the box space 20, the both sides of the front face and the reverse face (furthermore, peripheral side faces) of the first device 3 make contact with (is exposed to) the exhaust gas (heating medium) (via the second device 4), and is heated and/or cooled.

That is, both sides of the front face and the reverse face of the first device 3 are heated and/or cooled by the temperature change over time of the engine 16 (heat source 2), and the heating medium that conducts heat of the engine 16.

In this manner, a periodic high-temperature state or low-temperature state can be caused in the first device 3, and polarization can be caused in the first device 3 in accordance with the effects (e.g., piezoelectric effect, pyroelectric effect, etc.) of the element (e.g., piezoelectric element, pyroelectric element, etc.).

Thus, in the power-generating system 1, a net generating power can be taken out from the first devices 3 via the second devices 4 as a periodically changing waveform (e.g., alternating current, pulsating current, etc.).

Furthermore, in the power-generating system 1, the temperature of the branch pipe 18*a* and the branch pipe 18*c*, and the temperature of the branch pipe 18*b* and the branch pipe 18*d* change at the same period, but at a different phase periodically, and therefore a net generating power can be taken out continuously as a periodically changing waveform (e.g., alternating current, pulsating current, etc.).

Then, the exhaust gas passes through the branch pipes 18, and then is supplied to the collection pipe 19. After the collection, the exhaust gas is supplied to the catalyst mount portion 12, and is purified by the catalyst provided in the catalyst mount portion 12. Thereafter, the exhaust gas is supplied to the exhaust pipe 13, and after the noise is reduced in the muffler 14, the exhaust gas is discharged outside through the outlet pipe 15.

At this time, the exhaust gas that passes through the branch pipes 18 is collected in the collection pipe 19, and therefore the temperature of the exhaust gas that passes through the collection pipe 19, the catalyst mount portion 12, the exhaust pipe 13, the muffler 14, and the outlet pipe 15 in sequence is smoothed.

Thus, the temperature of the collection pipe 19, the catalyst mount portion 12, the exhaust pipe 13, the muffler 14, and the outlet pipe 15, which allows the exhaust gas with its temperature smoothed to pass through usually does not change over time, keeping a substantially constant temperature.

Therefore, when the collection pipe 19, the catalyst mount portion 12, the exhaust pipe 13, the muffler 14, or the outlet pipe 15 is used as the heat source 2, and the above-described first devices 3 are disposed at the surrounding or inside thereof, the voltage of the net generating power taken out from the first device 3 is small, and also is constant (direct current voltage).

Thus, in such a method, the voltage of the obtained net generating power cannot be increased efficiently with a simple structure, which is disadvantageous in that storage of electricity is inefficient.

On the other hand, as described above, when the first device 3 is disposed at the inner space of the branch pipes 18, a periodic high-temperature state or low-temperature state is allowed in the first device 3 based on the temperature change over time of the heat source 2, and periodic polarization can be caused in the first device 3 in accordance with the effects (e.g., piezoelectric effect, pyroelectric effect, etc.) of the device (e.g., piezoelectric element, pyroelectric element, etc.).

Thus, in the power-generating system 1, a net generating power can be taken out from the first devices 3 via the second devices 4 as a periodically changing waveform (e.g., alternating current, pulsating current, etc.).

Thereafter, in this method, for example, as shown by the dotted line in FIG. 2, the voltage of the net generating power obtained as described above is increased in the booster 5 connected to the second device 4 under the state of a periodically changing waveform (e.g., alternating current, pulsating current, etc.), and then after the net generating power with its voltage boosted is converted to a direct current voltage in an alternating current/direct current converter 6, the net generating power is stored in the battery 7. The net generating power stored in the battery 7 is used suitably as a motive power for the automobile 10, or for various electrical accessories mounted in the automobile 10.

In such a power-generating system 1, the heat source 2 having a temporal temperature variation is used, and therefore a changing voltage (e.g., alternating current voltage) can be taken out, and as a result, compared with the case where a constant voltage (direct current voltage) is taken out and converted with a DC-DC converter, excellently efficient boosting of voltage and storage of electricity can be achieved.

Particularly, with such a power-generating system 1, improvement in power generation efficiency can be achieved.

Thus, in such a power-generating system 1, 80% or higher of the total surface area of the first device 3 is heated and/or cooled by the heat source 2, and therefore excellently efficient power generation can be achieved.

Furthermore, by using a sheet first device 3, and by heating and/or cooling both of the front face and the reverse face thereof with the heat source 2, 80% or higher of the total surface area of the first device 3 can be heated and/or cooled easily, and excellently efficient power generation can be achieved.

FIG. 4 is a schematic diagram illustrating the configuration of another embodiment of the first device shown in FIG. 3.

In the description above, an element (piezoelectric element, pyroelectric element, etc.) formed to be thin (formed into a sheet) is used as the first device 3, but such an element can be layered to be used as the first device 3, for example, as shown in FIG. 4.

In such a case, the second device 4 (for example, electrodes, lead wires, etc.) is interposed between the plurality of elements, and the elements are connected electrically to be in series at the time of polarization to obtain a layered first device 3.

Then, the thus obtained layered first device 3 (multi-layer) is disposed so as to be in contact with the heat source 2, or, in contact with (exposed to) a heating medium (the above-described exhaust gas, light, etc.) that conducts the heat of the heat source 2.

Then, in the same manner as described above, 80% or higher, preferably 85% or higher, more preferably 90% or higher of the total surface area of the first device 3 (multi-layer) is heated and/or cooled with the heat source 2, and in this manner, the layered elements are heated or cooled simultaneously.

Preferably, both of the front face and the reverse face (furthermore, peripheral side faces) of the layered first device 3 (multi-layer) are heated and/or cooled in the same manner as described above with the heat source 2, and in this manner, the layered elements are heated or cooled simultaneously.

In the layered first device 3, the front face is the outermost surface on the front side (front face of the uppermost element) of the layered elements, and the reverse face is the outermost surface of the reverse side (reverse face of the lowermost element) of the layered elements.

Then, in the thus obtained power-generating system 1 as well, 80% or higher of the total surface area of the first device 3 (multi-layer) is heated and/or cooled with the heat source 2, and thus excellently efficient power generation can be achieved.

Furthermore, by using a sheet first device 3, and by heating and/or cooling both of the front face and the reverse face thereof with the heat source 2, 80% or higher of the total surface area of the first device 3 can be heated and/or cooled easily, and excellently efficient power generation can be achieved.

Furthermore, by using the layered first device 3, polarization can be caused simultaneously in the plurality of elements and their electrical connection in series is allowed in this manner, and thus a high net generating power can be taken out compared with the case where the first device 3 is used singly (as a single layer).

Second Embodiment

In the following, a second embodiment of the present invention is described.

In the following, detailed description for the same component and principle as in the first embodiment above is omitted.

Figure 5:
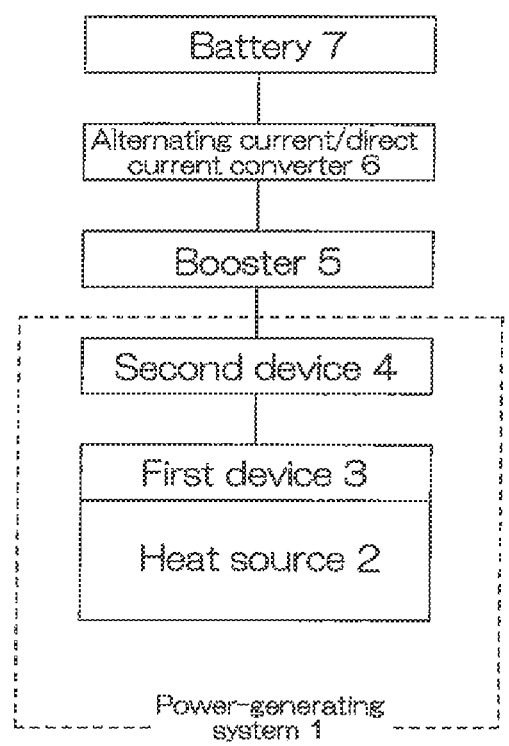
FIG. 5 is a schematic diagram illustrating the configuration of a second embodiment of the power-generating system of the present invention.

FIG. 5 is a schematic diagram illustrating the configuration of a second embodiment of the power-generating system of the present invention, FIG. 6 is an enlarged schematic diagram illustrating the configuration of the second embodiment of the first device and the second device used in the power-generating system of the present invention.

In FIG. 5, a power-generating system 1 includes a heat source 2 which is able to produce temporal temperature variation; a plurality of first devices 3 in which polarization occurs due to a temperature change of the heat source 2; and a plurality of second devices 4 that take out a net generating power from the first device 3. In the second embodiment, the first device 3 is suitably disposed without limitation of the contact percentage of the heat source 2 relative to the above-described total surface area.

In the power-generating system 1 of this embodiment, as shown in FIG. 6, the first device 3 and the second device 4 are layered alternately.

To be specific, in the power-generating system 1, the first device 3 is formed to be thin (into a sheet), and the second device 4 is formed to be thin (into a sheet, for example, electrode, etc.).

Then, on the second device 4, the first device 3 and the second device 4 are sequentially layered, the uppermost layer being the second device 4. In this manner, a layered module 21, in which the first devices 3 and the second devices 4 are layered alternately so that the second devices 4 are at the uppermost layer and at the lowermost layer, is formed.

The number of the first device 3 included in the layered module 21 is, for example, 10 to 140, preferably 50 to 100, and the number of the second device 4 included in the layered module 21 is, for example, 11 to 161, preferably 51 to 101.

In the layered module 21, the thickness of one first device 3 is, for example, 5 to 15 µm, preferably 8 to 12 µm; the thickness of one second device 4 is, for example, 0.5 to 2 µm, preferably 1 to 1.5 µm; and the thickness of the layered module 21 is, for example, 55 to 2000 µm, preferably 550 to 1300 µm.

In the thus obtained layered module 21, a plurality of first devices 3 are electrically connected with the plurality of second devices 4 interposed therebetween.

The layered module 21 is disposed so as to be in contact with the heat source 2, or, in contact with (exposed to) a heating medium (the above-described exhaust gas, light, etc.) that conducts the heat of the heat source 2.

In a power-generating system 1 shown in FIG. 5, the second device 4 is electrically connected to, in sequence, a booster 5, an alternating current/direct current converter (AC-DC converter) 6, and a battery 7.

To generate electricity by such a power-generating system 1, for example, first, by allowing the temperature of the heat source 2 to vary temporally, preferably by changing the temperature periodically, the layered module 21 (including the first device 3) is heated/or cooled by the heat source 2.

In accordance with such a temperature change, polarization is caused preferably periodically in the above-described first device 3. Thereafter, through the second device 4, a net generating power is taken out as a periodically changing waveform (e.g., alternating current, pulsating current, etc.) in accordance with the periodical polarization of the first device 3.

The conditions for power generation are the same as described above.

With such a power-generating system 1, power generation efficiency can be improved.

Thus, in such a power-generating system 1, the plurality of first devices 3 and the plurality of second devices 4 are alternately layered, and therefore the plurality of first devices 3 can be electrically connected with the plurality of second devices 4 interposed therebetween, and excellently efficient power generation can be achieved, while saving space.

Figure 7:
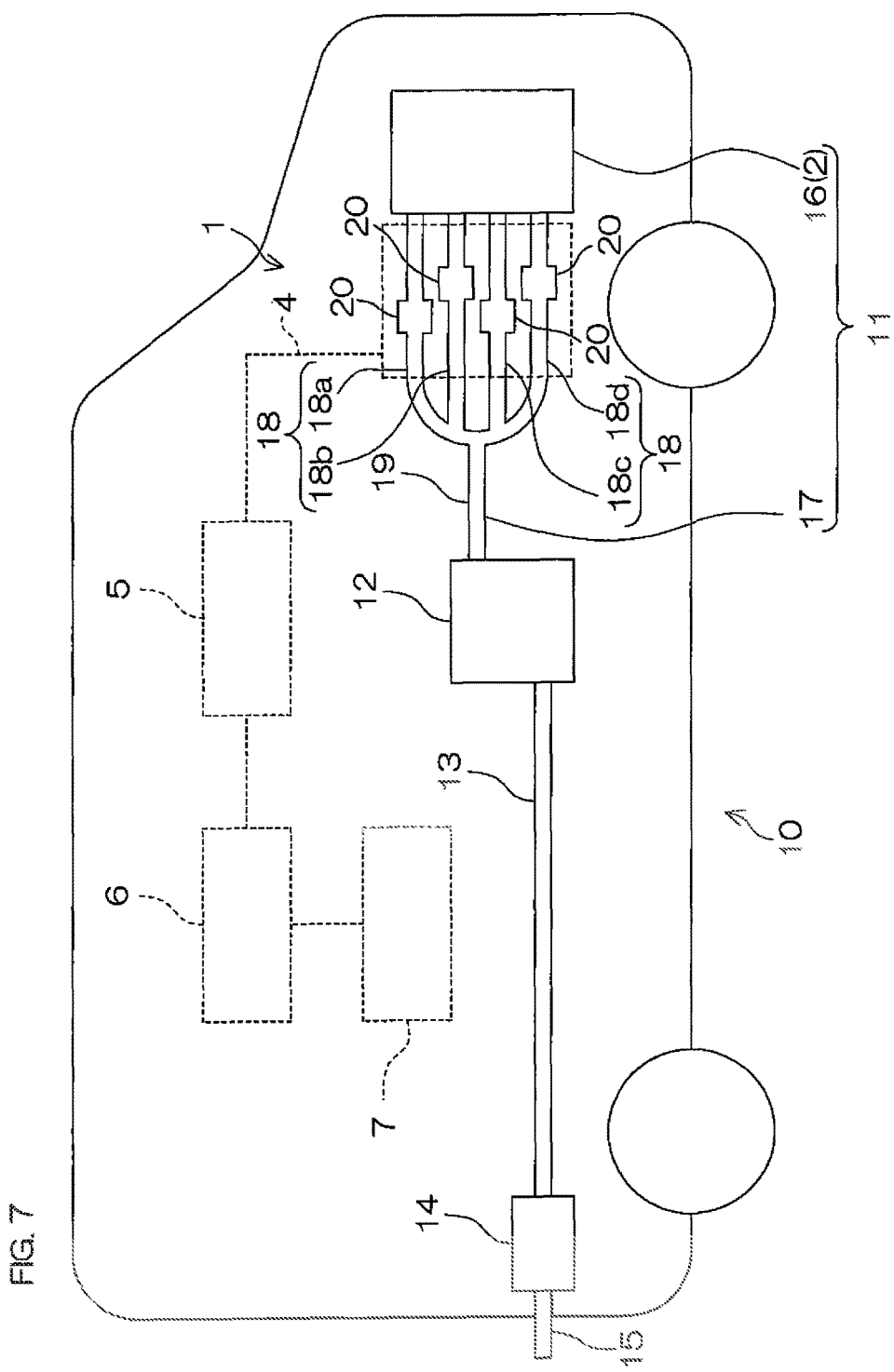
FIG. 7 is a schematic diagram illustrating the configuration of the second embodiment of the power-generating system of the present invention on board.
Figure 8:
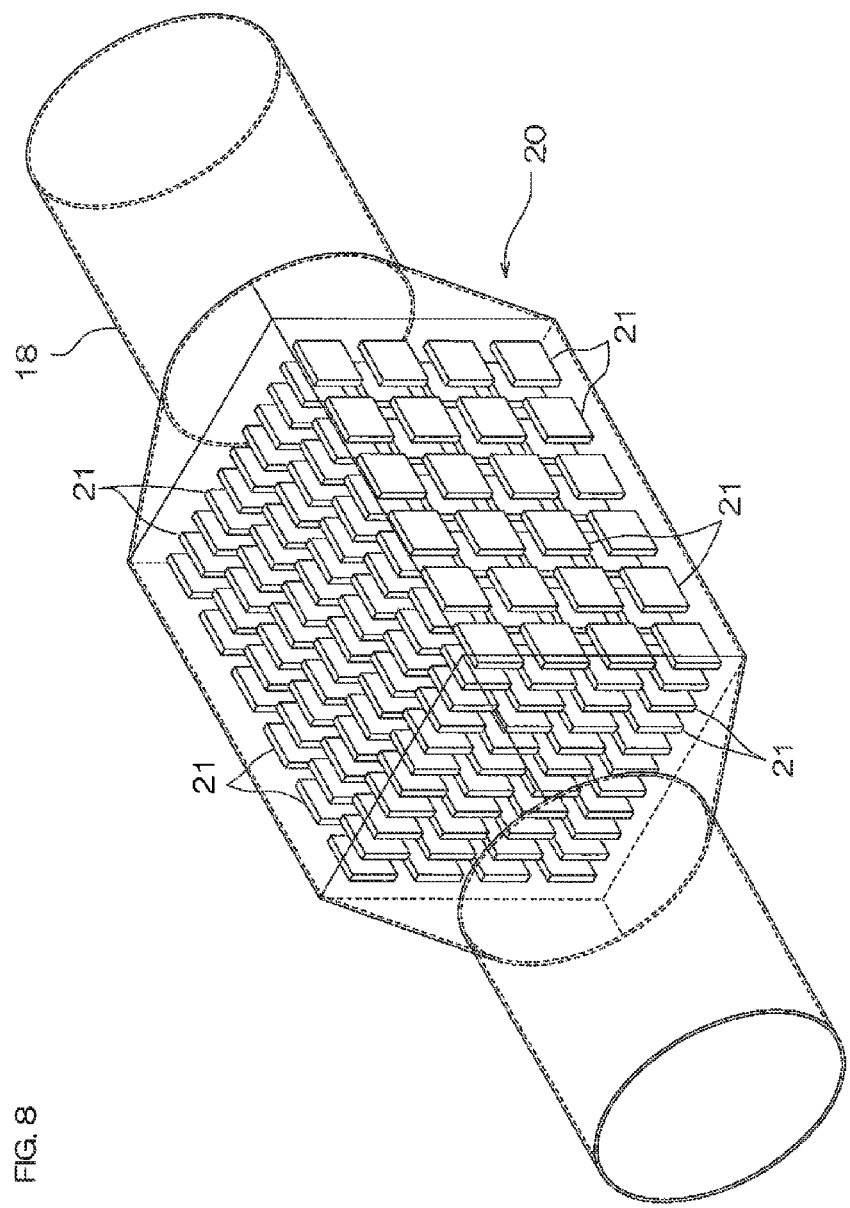
FIG. 8 is an enlarged view of a relevant part of the power-generating system shown in FIG. 7.

FIG. 7 is a schematic diagram illustrating the configuration of a second embodiment of the power-generating system of the present invention on board, and FIG. 8 is an enlarged view of a relevant part of the power-generating system shown in FIG. 7.

In FIG. 7, an automobile 10 includes an internal combustion engine 11, a catalyst mount portion 12, an exhaust pipe 13, a muffler 14, and an outlet pipe 15.

The internal combustion engine 11 includes an engine 16, and an exhaust manifold 17.

The engine 16 is a multicylinder (four cylinder), multistroke cycle (four-stroke cycle) engine, and upstream end portions of branch pipes 18 (described later) of the exhaust manifold 17 are connected to the cylinders.

The exhaust manifold 17 is provided for collecting the exhaust gas discharged from the cylinders of the engine 16; and includes a plurality of (four) branch pipes 18 (when these have to be distinguished, these are referred to as, from the top in FIG. 7, a branch pipe 18a, a branch pipe 18b, a branch pipe 18c, and a branch pipe 18d) connected to the cylinders of the engine 16, and a collection pipe 19 that integrates the branch pipes 18 at a downstream side of the branch pipes 18.

Each of the branch pipes 18 includes one box space 20 on its way in the flow direction. The box space 20 is a substantially rectangular parallelepiped space intervened in and communicating with the branch pipes 18, and inside therein, includes the above-described layered module 21 (layered module 21 composed of a plurality of first devices 3 and a plurality of second devices 4 (ref: FIG. 8).

In such an exhaust manifold 17, the upstream end portions of the branch pipes 18 are connected to the cylinders of the engine 16, and the downstream end portions of the branch pipe 18 are connected to the upstream end portion of the collection pipe 19. The downstream end portion of the collection pipe 19 is connected to the upstream end portion of the catalyst mount portion 12.

The catalyst mount portion 12 includes, for example, a catalyst carrier and a catalyst coated thereon, and is connected to the downstream end portion of the internal combustion engine 11 (exhaust manifold 17) to purify toxic components such as hydrocarbon (HC), nitrogen oxide ($NO_x$), and carbon monoxide (CO) contained in the exhaust gas discharged from the internal combustion engine 11.

The exhaust pipe 13 is provided for guiding the exhaust gas purified at the catalyst mount portion 12 to the muffler 14, and the upstream end portion thereof is connected to the catalyst mount portion 12, and the downstream end portion thereof is connected to the muffler 14.

The muffler 14 is provided to reduce the noise generated in the engine 16 (in particular, power stroke), and the upstream end portion thereof is connected to the downstream end portion of the exhaust pipe 13. The downstream end portion of the muffler 14 is connected to the upstream end portion of the outlet pipe 15.

The outlet pipe 15 is provided for releasing, into the air, the exhaust gas that was discharged from the engine 16, and was purified, with its noise reduced passing through the exhaust manifold 17, the catalyst mount portion 12, the exhaust pipe 13, and the muffler 14 sequentially. The upstream end portion of the outlet pipe 15 is connected to the downstream end portion of the muffler 14, and the downstream end portion of the outlet pipe 15 is open into the air.

The automobile 10 is equipped with, as shown by the dotted line in FIG. 7, the power-generating system 1.

The power-generating system 1 includes, as described above, a heat source 2, first devices 3, and second devices 4.

In the power-generating system 1, an engine 16 of the internal combustion engine 11 is used as the heat source 2, and as shown in FIG. 8, layered modules 21 including the first devices 3 and the second devices 4 are disposed in a box space 20 of the branch pipe 18.

The layered modules 21 are formed into sheets, and in the box space 20, are arranged in line with a space provided from each other, and are fixed by a fixing component which is not shown.

In this manner, both of the front face and the reverse face, and furthermore, peripheral side faces of the layered module 21 are exposed to the air inside the box space 20, so that they can be in contact with (exposed to) the exhaust gas.

The power-generating system 1 is electrically connected, through the second device 4 (for example, lead wires, etc.), which is not shown, as shown in FIG. 7, in sequence, to the booster 5, the alternating current/direct current converter 6, and the battery 7.

In such an automobile 10, the engine 16 is driven by repetitive up-down motion of pistons in cylinders, performing the intake stroke, the compression stroke, the power stroke, and the exhaust stroke in sequence, thereby increasing and decreasing the temperature thereof over time.

To be more specific, for example, in the two cylinders of the cylinder connected to the branch pipe 18a and the cylinder connected to the branch pipe 18c, the pistons work together to conduct the intake stroke, the compression stroke, the power stroke, and the exhaust stroke synchronously. This allows fuel combustion and output of motive power, allowing a high temperature exhaust gas to pass through inside of the branch pipe 18a and the branch pipe 18c in the exhaust stroke.

At this time, the heat of the engine 16 is conducted through the exhaust gas (heating medium); and the internal temperature of the branch pipe 18a and the branch pipe 18c increases in the exhaust stroke and decreases in other strokes (intake stroke, compression stroke, and power stroke), and therefore increases and decreases over time in accordance with the piston cycle, thus repeating a high-temperature state and a low-temperature state periodically.

On the other hand, at different timing from these two cylinders, in the two cylinders of the cylinder connected to the branch pipe 18b and the cylinder connected to the branch pipe 18d, pistons work together to conduct the intake stroke, the compression stroke, the power stroke, and the exhaust stroke synchronously. This allows fuel combustion and output of motive power at different timing from the branch pipe 18a and the branch pipe 18c, allowing a high temperature exhaust gas to pass through inside of the branch pipe 18b and the branch pipe 18d in the exhaust stroke.

At this time, the heat of the engine 16 is conducted through the exhaust gas (heating medium), the internal temperature of the branch pipe 18b and the branch pipe 18d increases in the exhaust stroke, and decreases in other strokes (intake stroke, compression stroke, and power stroke), and therefore increases and decreases over time in accordance with the piston cycle, thus repeating a high-temperature state and a low-temperature state periodically.

The periodic temperature change occurs at the same period, but at a different phase from the periodic temperature change of the branch pipe 18a and the branch pipe 18c.

In the power-generating system 1, as described above, sheet layered modules 21 are disposed inside each of the branch pipes 18 (in the box space 20).

Thus, when the exhaust gas discharged from the engine 16 (heat source 2) is introduced into the branch pipes 18 and the box spaces 20 are filled with the exhaust gas, in the box space 20, the both sides of the front face and the reverse face (furthermore, peripheral side faces) of the layered module 21 make contact with (is exposed to) the exhaust gas (heating medium), and is heated and/or cooled.

That is, both sides of the front face and the reverse face of the layered module 21 are heated and/or cooled by the temperature change over time of the engine 16 (heat source 2), and the heating medium that conducts heat of the engine 16.

In this manner, a periodic high-temperature state or low-temperature state can be caused in the first device 3 contained in the layered module 21, and polarization can be caused in the first device 3 in accordance with the effects (e.g., piezoelectric effect, pyroelectric effect, etc.) of the element (e.g., piezoelectric element, pyroelectric element, etc.).

Thus, in the power-generating system 1, a net generating power can be taken out from the first devices 3 via the second devices 4 as a periodically changing waveform (e.g., alternating current, pulsating current, etc.).

Furthermore, in the power-generating system 1, the temperature of the branch pipe 18a and the branch pipe 18c, and the temperature of the branch pipe 18b and the branch pipe 18d change at the same period, but at a different phase periodically, and therefore a net generating power can be taken out continuously as a periodically changing waveform (e.g., alternating current, pulsating current, etc.).

Then, the exhaust gas passes through the branch pipes 18, and then is supplied to the collection pipe 19. After the collection, the exhaust gas is supplied to the catalyst mount portion 12, and is purified by the catalyst provided in the catalyst mount portion 12. Thereafter, the exhaust gas is supplied to the exhaust pipe 13, and after the noise is reduced in the muffler 14, the exhaust gas is discharged outside through the outlet pipe 15.

At this time, the exhaust gas that passes through the branch pipes 18 is collected in the collection pipe 19, and therefore the temperature of the exhaust gas that passes through the collection pipe 19, the catalyst mount portion 12, the exhaust pipe 13, the muffler 14, and the outlet pipe 15 in sequence is smoothed.

Thus, the temperature of the collection pipe 19, the catalyst mount portion 12, the exhaust pipe 13, the muffler 14, and the outlet pipe 15, which allows the exhaust gas with its temperature smoothed to pass through usually does not change over time, keeping a substantially constant temperature.

Therefore, when the collection pipe 19, the catalyst mount portion 12, the exhaust pipe 13, the muffler 14, or the outlet pipe 15 is used as the heat source 2, and the above-described layered module 21 (including the first devices 3) is disposed at the surrounding or inside thereof, the voltage of the net generating power taken out from the first device 3 is small, and also is constant (direct current voltage).

Thus, in such a method, the voltage of the obtained net generating power cannot be increased efficiently with a simple structure, which is disadvantageous in that storage of electricity is inefficient.

On the other hand, as described above, when the layered modules 21 (including the first devices 3) are disposed at the inner spaces of the branch pipes 18, a periodic high-temperature state or low-temperature state is allowed in the first device 3 based on the temperature change over time of the heat source 2, and periodic polarization can be caused in the first device 3 in accordance with the effects (e.g., piezoelectric effect, pyroelectric effect, etc.) of the device (e.g., piezoelectric element, pyroelectric element, etc.).

Thus, in the power-generating system 1, a net generating power can be taken out from the first devices 3 via the second devices 4 as a periodically changing waveform (e.g., alternating current, pulsating current, etc.). Thereafter, in this method, for example, as shown by the dotted line in FIG. 7, the voltage of the net generating power obtained as described above is increased in the booster 5 connected to the second device 4 under the state of a periodically changing waveform (e.g., alternating current, pulsating current, etc.), and then after the net generating power with its voltage boosted is converted to a direct current voltage in an alternating current/direct current converter 6, the net generating power is stored in the battery 7. The net generating power stored in the battery 7 is used suitably as a motive power for the automobile 10, or for various electrical accessories mounted in the automobile 10.

In such a power-generating system 1, the heat source 2 having a temporal temperature variation is used, and therefore a changing voltage (e.g., alternating current voltage) can be taken out, and as a result, compared with the case where a constant voltage (direct current voltage) is taken out and converted with a DC-DC converter, excellently efficient boosting of voltage and storage of electricity can be achieved.

Particularly, with such a power-generating system, improvement in power generation efficiency can be achieved.

Thus, in such a power-generating system 1, the plurality of first devices 3 and second devices 4 are alternately layered, and therefore the plurality of first devices 3 are electrically connected through the plurality of second devices 4, excellently efficient power generation can be achieved, and while saving space.

Third Embodiment

In the following, a third embodiment of the present invention is described.

Figure 9:
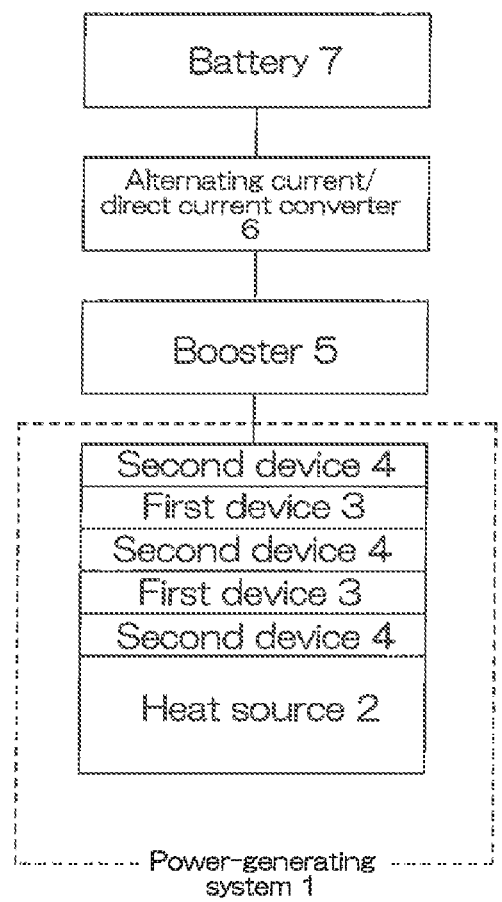
FIG. 9 is a schematic diagram illustrating the configuration of a third embodiment of the power-generating system of the present invention.
Figure 10:
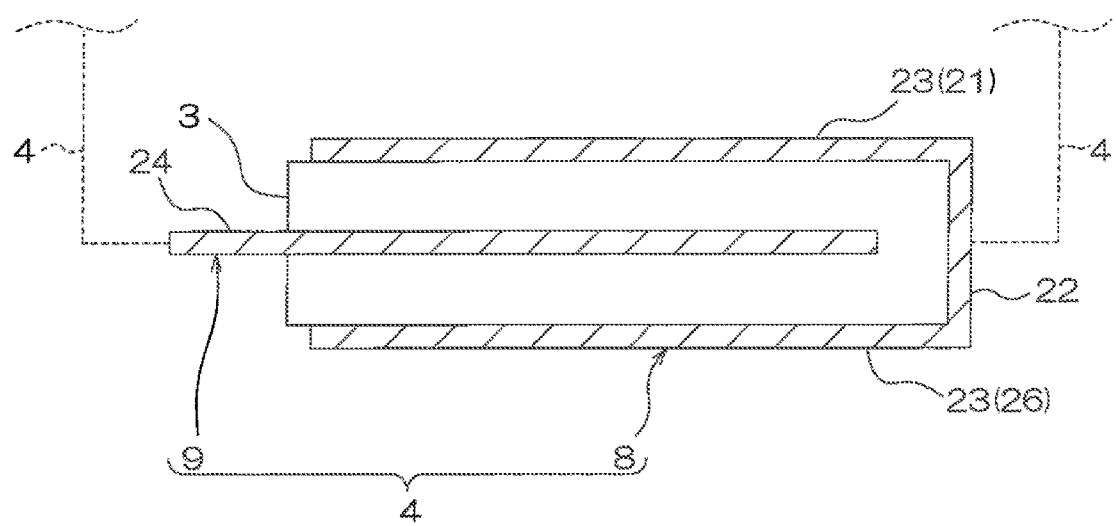
FIG. 10 is an enlarged schematic diagram illustrating the configuration of the third embodiment of the first device and the second device used in the power-generating system of the present invention.

FIG. 9 is a schematic diagram illustrating the configuration of a third embodiment the power-generating system of the present invention, and FIG. 10 is an enlarged schematic diagram illustrating the configuration of the third embodiment of the first device and the second device used in the power-generating system of the present invention.

In FIG. 9, the power-generating system 1 includes a heat source 2 which is able to produce temporal temperature variation, a first device 3 that undergoes polarization due to a temperature change of the heat source 2, and a second device 4 that takes out a net generating power from the first device 3. In the third embodiment as well, the first device 3 is suitably disposed without limitation of the contact percentage of the heat source 2 relative to the above-described total surface area (in the fourth embodiment to be described later as well).

Then, in the thus obtained power-generating system 1, the second device 4 includes, as shown in FIG. 10, a first electrode 8 and a second electrode 9 having different polarities from each other.

The first electrode 8 includes two outer electrodes 26, and the outer electrodes 26 are disposed to face each other so as to sandwich the first device 3 from outside (both sides of the front face and the reverse face), and are electrically connected to each other.

To be more specific, the first electrode 8 is formed into a substantially U-shape in cross section, and includes a base 22 provided along the direction perpendicular to the extension direction of the first device 3, and two walls 23 extending toward one side in the longitudinal direction from both end edges of the base 22. In the first electrode 8, the two walls 23 are disposed, as the outer electrodes 26, so as to be in contact with the front face and the reverse face of the first device 3. The base 22 is disposed so as to electrically connect the two outer electrodes 26, and to be in contact with the end portion of the first device 3 at the other side in the longitudinal direction (the other side relative to the one side toward which the walls 23 are extended).

The second electrode 9 includes an inner electrode 24 disposed inside the first device 3 between the two outer electrodes 26.

To be specific, the inner electrode 24 is formed between the two outer electrodes 26 disposed to face each other so as to extend in parallel with the outer electrodes 26, and one end portion in the longitudinal direction projects from the first device 3, and the other end portion in the longitudinal direction is embedded in the first device 3 so as not to contact with the base 22.

To the first electrode 8 and the second electrode 9, as shown in the broken line in FIG. 10, lead wires (second devices 4) are electrically connected.

In a power-generating system 1 shown in FIG. 9, the second device 4 is electrically connected to, in sequence, a booster 5, an alternating current/direct current converter (AC-DC converter) 6, and a battery 7.

To generate electricity by such a power-generating system 1, for example, first, the temperature of the heat source 2 is increased or decreased over time; preferably, the temperature is changed periodically to heat and/or cool the first device 3 with the heat source 2. In accordance with such a temperature change, polarization is caused preferably periodically in the above-described first device 3.

Thereafter, through the second device 4, a net generating power is taken out as a periodically changing waveform (e.g., alternating current, pulsating current, etc.) in accordance with the periodical polarization of the first device 3.

The conditions for power generation are the same as described above.

With such a power-generating system 1, power generation efficiency can be improved.

Thus, in such a power-generating system 1, the second device 4 includes the first electrode 8 including two outer electrodes 26 disposed to sandwich the first device 3 from outside and electrically connected, and the second electrode 9 including the inner electrode 24 disposed in the first device 3 between the two outer electrodes 26.

Thus, in the power-generating system 1, the first device 3 can generate electricity at at least two portions, i.e., between one outer electrode 26 and the inner electrode 24, and between the other outer electrode 26 and the inner electrode 24. With such a power-generating system 1, power generation efficiency can be improved compared with the case where, for example, the first device 3 generates electricity only at between the two outer electrodes 26 provided separately without providing the inner electrode 24.

As a result, with such a power-generating system 1, for example, with a power-generating system 1 of about the same size, a high output can be achieved compared with the case where the second devices 4 are disposed so as to sandwich the first device 3, and without disposing the second device 4 inside the first device 3. Furthermore, even if the size of the power-generating system 1 is reduced, output of about the same level with the case where the second devices 4 are disposed so as to sandwich the first device 3 and without disposing the second device 4 in the first device 3, while saving space.

Figure 11:
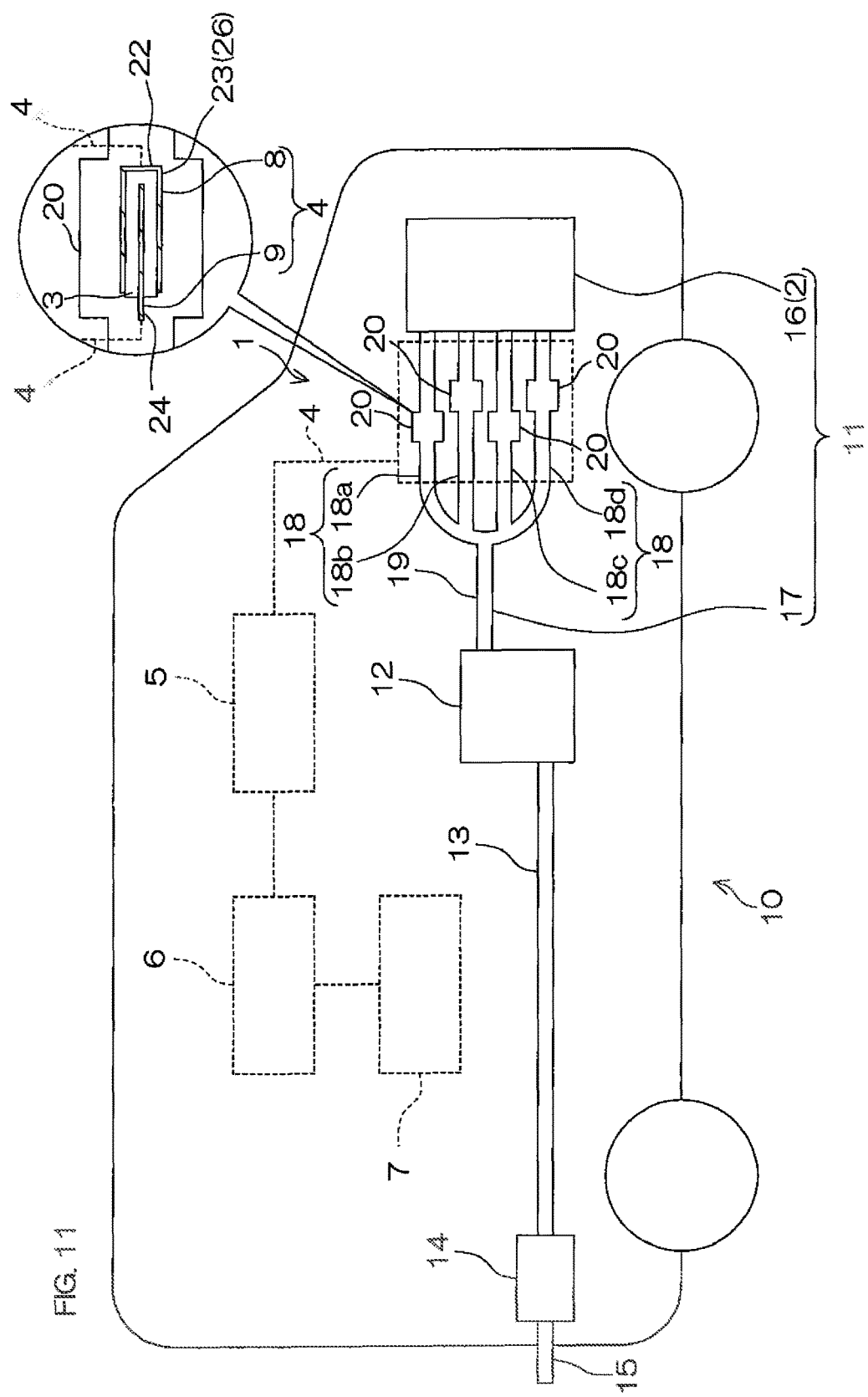
FIG. 11 is a schematic diagram illustrating the configuration of the third embodiment of the power-generating system of the present invention on board.

FIG. 11 is a schematic diagram illustrating the configuration of a third embodiment of the power-generating system of the present invention on board.

In FIG. 11, an automobile 10 includes an internal combustion engine 11, a catalyst mount portion 12, an exhaust pipe 13, a muffler 14, and an outlet pipe 15.

The internal combustion engine 11 includes an engine 16, and an exhaust manifold 17.

The engine 16 is a multicylinder (four cylinder), multi-stroke cycle (four-stroke cycle) engine, and upstream end portions of branch pipes 18 (described later) of the exhaust manifold 17 are connected to the cylinders.

The exhaust manifold 17 is provided for collecting the exhaust gas discharged from the cylinders of the engine 16; and includes a plurality of (four) branch pipes 18 (when these have to be distinguished, these are referred to as, from the top in FIG. 11, a branch pipe 18a, a branch pipe 18b, a branch pipe 18c, and a branch pipe 18d) connected to the cylinders of the engine 16, and a collection pipe 19 that integrates the branch pipes 18 at a downstream side of the branch pipes 18.

Each of the branch pipes 18 includes one box space 20 on its way in the flow direction. The box space 20 is a substantially rectangular parallelepiped space intervened in and communicating with the branch pipes 18, and inside therein, includes the first device 3 and the second devices 4.

In such an exhaust manifold 17, the upstream end portions of the branch pipes 18 are connected to the cylinders of the engine 16, and the downstream end portions of the branch pipes 18 are connected to the upstream end portion of the collection pipe 19. The downstream end portion of the collection pipe 19 is connected to the upstream end portion of the catalyst mount portion 12.

The catalyst mount portion 12 includes, for example, a catalyst carrier and a catalyst coated thereon, and is connected to the downstream end portion of the internal combustion engine 11 (exhaust manifold 17) to purify toxic components such as hydrocarbon (HC), nitrogen oxide ($NO_x$), and carbon monoxide (CO) contained in the exhaust gas discharged from the internal combustion engine 11.

The exhaust pipe 13 is provided for guiding the exhaust gas purified at the catalyst mount portion 12 to the muffler 14, and the upstream end portion thereof is connected to the catalyst mount portion 12, and the downstream end portion thereof is connected to the muffler 14.

The muffler 14 is provided to reduce the noise generated in the engine 16 (in particular, power stroke), and the upstream end portion thereof is connected to the downstream end portion of the exhaust pipe 13. The downstream end portion of the muffler 14 is connected to the upstream end portion of the outlet pipe 15.

The outlet pipe 15 is provided for releasing, into the air, the exhaust gas that was discharged from the engine 16, and was purified, with its noise reduced passing through the exhaust manifold 17, the catalyst mount portion 12, the exhaust pipe 13, and the muffler 14 sequentially. The upstream end portion of the outlet pipe 15 is connected to the downstream end portion of the muffler 14, and the downstream end portion of the outlet pipe 15 is open into the air.

The automobile 10 is equipped with, as shown by the dotted line in FIG. 11, the power-generating system 1.

The power-generating system 1 includes, as described above, a heat source 2, a first device 3, and a second device 4.

That is, in the power-generating system 1, an engine 16 of the internal combustion engine 11 is used as the heat source 2, and in the box spaces 20 of the branch pipes 18, the first devices 3 and the second devices 4 are disposed.

To be more specific, in the box space 20, the outer electrode 26 (base 22) side of the second device 4 is disposed upstream in the flow direction, whereas the inner electrode 24 is disposed downstream in the flow direction, and the first device 3 is disposed to be in contact with those second devices 4. The first device 3 and the second device 4 are fixed with a fixing component, which is not shown.

The power-generating system 1 is electrically connected to, as shown in FIG. 11, in sequence, a booster 5, an alternating current/direct current converter 6, and a battery 7, through the second device 4 (for example, lead wires, etc.), which is not shown.

In such an automobile 10, the engine 16 is driven by repetitive up-down motion of pistons in cylinders, performing the intake stroke, the compression stroke, the power stroke, and the exhaust stroke in sequence, thereby increasing and decreasing the temperature thereof over time.

To be more specific, for example, in the two cylinders of the cylinder connected to the branch pipe 18*a* and the cylinder connected to the branch pipe 18*c*, the pistons work together to conduct the intake stroke, the compression stroke, the power stroke, and the exhaust stroke synchronously. This allows fuel combustion and output of motive power, allowing a high temperature exhaust gas to pass through inside of the branch pipe 18*a* and the branch pipe 18*c* in the exhaust stroke.

At this time, the heat of the engine 16 is conducted through the exhaust gas (heating medium); and the internal temperature of the branch pipe 18*a* and the branch pipe 18*c* increases in the exhaust stroke and decreases in other strokes (intake stroke, compression stroke, and power stroke), and therefore increases and decreases over time in accordance with the piston cycle, thus repeating a high-temperature state and a low-temperature state periodically.

On the other hand, at different timing from these two cylinders, in the two cylinders of the cylinder connected to the branch pipe 18*b* and the cylinder connected to the branch pipe 18*d*, pistons work together to conduct the intake stroke, the compression stroke, the power stroke, and the exhaust stroke synchronously. This allows fuel combustion and output of motive power at different timing from the branch pipe 18*a* and the branch pipe 18*c*, allowing a high temperature exhaust gas to pass through inside of the branch pipe 18*b* and the branch pipe 18*d* in the exhaust stroke.

At this time, the heat of the engine 16 is conducted through the exhaust gas (heating medium), the internal temperature of the branch pipe 18*b* and the branch pipe 18*d* increases in the exhaust stroke, and decreases in other strokes (intake stroke, compression stroke, and power stroke), and therefore increases and decreases over time in accordance with the piston cycle, thus repeating a high-temperature state and a low-temperature state periodically.

The periodic temperature change occurs at the same period, but at a different phase from the periodic temperature change of the branch pipe 18*a* and the branch pipe 18*c*.

In the power-generating system 1, as described above, the first devices 3 and the second devices 4 are disposed inside each of the branch pipes 18 (in each of the box spaces 20).

Thus, when the exhaust gas discharged from the engine 16 (heat source 2) is introduced into the branch pipes 18 and the box spaces 20 are filled with the exhaust gas, in the box space 20, the first device 3 and the second device 4 make contact with (is exposed to) the exhaust gas (heating medium), and is heated and/or cooled.

At this time, as described above, in the box space 20, the first electrode 8 (in particular, the base 22 side) of the second device 4 is disposed upstream in the flow direction, whereas the second electrode 9 is disposed downstream in the flow direction, and the first device 3 is disposed to be in contact with those second devices 4.

Thus, for example, when the engine 16 (heat source 2) and the heating medium that conducts the heat of the engine 16 is in a high temperature state, the first device 3 is gradually heated from the portion that is in contact with the first electrode 8 (base 22) toward the portion that is in contact with the second electrode 9, and is brought into a high temperature state.

When the engine 16 (heat source 2) and the heating medium that conducts the heat of the engine 16 is in a low temperature state, the first device 3 is gradually cooled from the portion that is in contact with the second electrode 9 toward the portion that is in contact with the first electrode 8, and brought into a low temperature state.

In this manner, the first device 3 is heated and/or cooled based on the temperature change over time of the engine 16 (heat source 2), and the heating medium that conducts the heat of the engine 16.

In this manner, a periodic high-temperature state or low-temperature state can be caused in the first device 3, and polarization can be caused in the first device 3 in accordance with the effects (e.g., piezoelectric effect, pyroelectric effect, etc.) of the element (e.g., piezoelectric element, pyroelectric element, etc.).

Thus, in the power-generating system 1, a net generating power can be taken out from the first devices 3 via the second devices 4 as a periodically changing waveform (e.g., alternating current, pulsating current, etc.).

Furthermore, in the power-generating system 1, the temperature of the branch pipe 18*a* and the branch pipe 18*c*, and the temperature of the branch pipe 18*b* and the branch pipe 18*d* change at the same period, but at a different phase periodically, and therefore a net generating power can be taken out continuously as a periodically changing waveform (e.g., alternating current, pulsating current, etc.).

Then, the exhaust gas passes through the branch pipes 18, and then is supplied to the collection pipe 19. After the collection, the exhaust gas is supplied to the catalyst mount portion 12, and is purified by the catalyst provided in the catalyst mount portion 12. Thereafter, the exhaust gas is supplied to the exhaust pipe 13, and after the noise is reduced in the muffler 14, the exhaust gas is discharged outside through the outlet pipe 15.

At this time, the exhaust gas that passes through the branch pipes 18 is collected in the collection pipe 19, and therefore the temperature of the exhaust gas that passes through the collection pipe 19, the catalyst mount portion 12, the exhaust pipe 13, the muffler 14, and the outlet pipe 15 in sequence is smoothed.

Thus, the temperature of the collection pipe 19, the catalyst mount portion 12, the exhaust pipe 13, the muffler 14, and the outlet pipe 15, which allows the exhaust gas with its temperature smoothed to pass through usually does not change over time, keeping a substantially constant temperature.

Therefore, when the collection pipe 19, the catalyst mount portion 12, the exhaust pipe 13, the muffler 14, or the outlet pipe 15 is used as the heat source 2, and the first devices 3 are disposed at the surrounding or inside thereof, the voltage of the net generating power taken out from the first device 3 is small, and also is constant (direct current voltage).

Thus, in such a method, the voltage of the obtained net generating power cannot be increased efficiently with a simple structure, which is disadvantageous in that storage of electricity is inefficient.

On the other hand, as described above, when the first devices 3 are disposed at the inner space of the branch pipes 18, a periodic high-temperature state or low-temperature state is allowed in the first device 3 based on the temperature change over time of the heat source 2, and periodic polarization can be caused in the first device 3 in accordance with the effects (e.g., piezoelectric effect, pyroelectric effect, etc.) of the device (e.g., piezoelectric element, pyroelectric element, etc.).

Thus, in the power-generating system 1, a net generating power can be taken out from the first devices 3 via the second devices 4 as a periodically changing waveform (e.g., alternating current, pulsating current, etc.).

Thereafter, in this method, for example, as shown by the dotted line in FIG. 11, the voltage of the net generating power obtained as described above is increased in the booster 5 connected to the second device 4 under the state of a periodically changing waveform (e.g., alternating current, pulsating current, etc.), and then after the net generating power with its voltage boosted is converted to a direct current voltage in an alternating current/direct current converter 6, the net generating power is stored in the battery 7. The net generating power stored in the battery 7 is used suitably as a motive power for the automobile 10, or for various electrical accessories mounted in the automobile 10.

In such a power-generating system 1, the heat source 2 having a temporal temperature variation is used, and therefore a changing voltage (e.g., alternating current voltage) can be taken out, and as a result, compared with the case where a constant voltage (direct current voltage) is taken out and converted with a DC-DC converter, excellently efficient boosting of voltage and storage of electricity can be achieved.

In such a power-generating system 1, the first device 3 is gradually heated from the portion that is in contact with the first electrode 8 toward the portion that is in contact with the second electrode 9 and is brought into a high temperature state, whereas the first device 3 is gradually cooled from the portion that is in contact with the second electrode 9 toward the portion that is in contact with the first electrode 8 and is brought into a low temperature state, and therefore polarization is caused in the first device 3 more efficiently.

Particularly, with such a power-generating system 1, improvement in power generation efficiency can be achieved.

Thus, in such a power-generating system 1, the second devices 4 are disposed to face each other so as to sandwich the first device 3 from outside, and includes a first electrode 8 including two outer electrodes 26 that are electrically connected to each other, and a second electrode 9 including the inner electrode 24 that is disposed in the first device 3 between the two outer electrodes 26.

Thus, as described above, in such a power-generating system 1, the first device 3 can generate electricity at at least two portions, i.e., between one outer electrode 26 and the inner electrode 24, and between the other outer electrode 26 and the inner electrode 24. With such a power-generating system 1, power generation efficiency can be improved compared with the case where, for example, the first device 3 generates electricity only at between the two outer electrodes 26 provided separately without providing the inner electrode 24.

As a result, with such a power-generating system 1, for example, with a power-generating system 1 of about the same size, a high output can be achieved compared with the case where the second device 4 is disposed so as to sandwich the first device 3, and without disposing the second device 4 inside the first device 3. Furthermore, even if the size of the power-generating system 1 is reduced, output of about the same level with the case where the second device 4 is disposed so as to sandwich the first device 3 and without disposing the second device 4 in the first device 3 can be achieved, while saving space.

In the description above, one first device 3 is disposed per one box space 20, but for example, in the box space 20, a plurality of first devices 3 can be disposed, although the detail is not shown. In this case, the plurality of first devices 3 are disposed, for example, in line with a space provided from each other.

Fourth Embodiment

In the following, a forth embodiment of the present invention is described.

In the following, detailed description for the same component and principle as in the first embodiment above is omitted.

Figure 12:
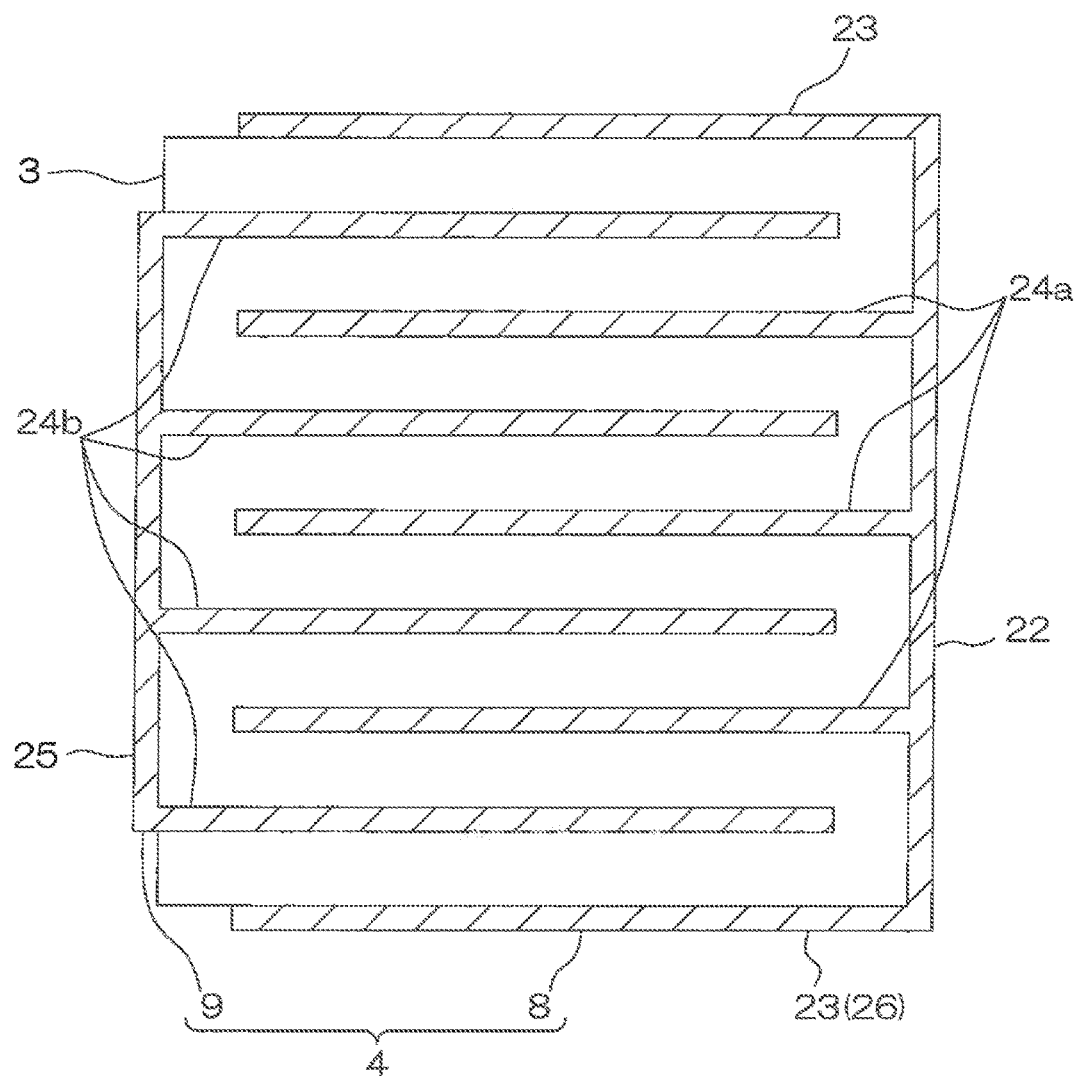
FIG. 12 is an enlarged schematic diagram illustrating the configuration of a fourth embodiment of the first device and the second device used in the power-generating system of the present invention.

FIG. 12 is an enlarged schematic diagram illustrating the configuration of a fourth embodiment of the first device and the second device used in the power-generating system of the present invention.

In the description above, the first electrode 8 include only two outer electrodes 26, and the second electrode 9 include only one inner electrode 24, but for example, as shown in FIG. 12, the first electrode 8 may include, in addition to the two outer electrodes 26, furthermore, inner electrodes 24, and the second electrode 9 may include a plurality of inner electrodes 24.

In the following, when the inner electrodes 24 included in the first electrode 8 are to be distinguished from the inner electrodes 24 included in the second electrode 9, the inner electrodes 24 included in the first electrode 8 are designated as first inner electrode 24a and the inner electrodes 24 included in the second electrode 9 are designated as second inner electrodes 24b.

In FIG. 12, the first electrode 8 includes two outer electrodes 26 that are disposed to face each other so as to sandwich the first device from outside, and at least one (three in FIG. 12) first inner electrode 24a that is electrically connected to the outer electrodes 26 and is disposed in the first device 3 between the two outer electrodes 26.

The plurality of (three) first inner electrodes 24a are provided between the two outer electrodes 26 (walls 23) so as to protrude toward one side in the longitudinal direction from the intermediate portion (intermediate portion in the direction of extension of the base 22) of the base 22 of the first electrode 8, and are disposed in parallel with a space provided therebetween. In this manner, the two outer electrodes 26 (wall 23) and the plurality of (three) first inner electrodes 24a are electrically connected with the base 22, and the first electrode 8 is formed into a comb shape.

The second electrode 9 includes a base 25 and a plurality of (four in FIG. 12) second inner electrodes 24b.

The base 25 is disposed to face the base 22 of the first electrode 8 with a space provided therebetween.

The second inner electrodes 24b are formed so as to protrude toward the other side in the longitudinal direction from the both end edges and the intermediate portion (the intermediate portion in the direction of extension of the base 25) of the base 25.

To be more specific, in FIG. 12, the two second inner electrodes 24b are extended from the both end edges of the base 25 toward the other side in the longitudinal direction. Between the two second inner electrodes 24b, separately, the plurality (two) of second inner electrodes 24b are provided so as to protrude toward the other side in the longitudinal direction from the intermediate portion (intermediate portion in the direction of extension of the base 25) of the base 25, and are disposed in parallel with a space provided therebetween.

In this manner, the plurality of (four) second inner electrodes 24b are electrically connected with the base 25, and the second electrode 9 is formed into a comb shape.

In this embodiment, the first inner electrodes 24a of the first electrode 8 and the second inner electrodes 24b of the second electrode 9 are disposed alternately in the first device 3.

That is, the second inner electrodes 24b of the second electrode 9 are inserted between the outer electrode 26 of the first electrode 9 and the first inner electrode 24a, and between the first inner electrodes 24a.

In this case, the first electrode 8 is disposed such that one end portion in the longitudinal direction of the outer electrode 26 and the one end portion in the longitudinal direction of the first inner electrode 24a are not in contact with the base 25 of the second electrode 9. The second electrode 9 is disposed such that the other end in the longitudinal direction of the second inner electrode 24b is not in contact with the base 22 of the first electrode 8.

Although not shown in detail, in such a power-generating system 1 as well, the second device 4 is electrically connected to, in sequence, a booster 5, an alternating current/direct current converter (AC-DC converter) 6, and a battery 7.

To generate electricity by such a power-generating system 1 including the first devices 3 and the second devices 4, in the same manner as described above, first, by heating and/or cooling the first device 3 with the heat source 2, polarization is caused preferably periodically in the first device 3. Thereafter, through the second device 4, a net generating power is taken out as a periodically changing waveform. Thereafter, the voltage of the net generating power obtained is increased in the booster 5 connected to the second device 4 under the state of a periodically changing waveform, and then after the net generating power with its voltage boosted is converted to a direct current voltage in an alternating current/direct current converter 6, the net generating power is stored in the battery 7.

In such a power-generating system 1 as well, in the same manner as described above, power generation efficiency can be improved, and thus a high output can be obtained, while saving space.

In particular, in such a power-generating system 1, in the first device 3, the first inner electrodes 24a of the first electrode 8 and the second inner electrodes 24b of the second electrode 9 are disposed alternately, and therefore power generation efficiency can be further improved. Therefore, a higher output can be obtained, while saving space.

Examples

While in the following, the present invention is described with reference to Examples, the present invention is not limited to any of them by no means.

Example 1

A bulk piezoelectric element (composition: Nb and Sn added PZT (Nb/Sn/Pb(Zr,Ti)O$_3$), Curie temperature 315° C., relative dielectric constant: about 2500, product number: H5C, manufactured by Sumitomo Metal (SMI) Electronics Devices Inc.) was cut into a sheet having a size of 25 mm×25 mm×1.2 mm, and a silver paste was applied on the front face and the reverse face thereof to give a size of 20 mm×20 mm×0.1 mm, thereby producing a silver electrode.

In the piezoelectric element, the front face has an area of 625 mm$^2$, the reverse face has an area of 625 mm$^2$, and the side face has an area of 30 mm$^2$. The total surface area thereof is 1370 mm$^2$, the percentage of the total area of the front face and the reverse face relative to the total surface area was 91.2%, the percentage of the area of the front face only relative to the total surface area was 45.6%.

Then, the obtained piezoelectric element and silver electrode were heat-treated in an electric furnace at 300° C. for 1 hour, thereby producing a sample.

Thereafter, using an aluminum tape of 20 mm×20 mm, one side of the two lead wires (lead) was attached onto the silver electrodes, and the other side thereof was connected to a digital multimeter.

A heat gun was used as the heat source, and the heat gun and the piezoelectric element were positioned so that the jet was directed to the both of the front face and the reverse face of the piezoelectric element and the jet was distant from the piezoelectric element by 5 cm.

By blowing hot air from the heat gun, and switching ON/OFF the heat gun over time, the temperature of the heat gun and hot air was allowed to change over time. This temperature change caused the temperature of the piezoelectric element to change over time and polarization was caused, and the generated voltage (net generating power) was taken out via the electrode and the lead wire.

The temperature of the piezoelectric element was measured with an infrared thermometer, and the hot air temperature was adjusted so that the respective temperatures of the front face and the reverse face were in the range of 100 to 250° C., and that the temperature difference of the front face and the reverse face was about 0° C., and that the temperature change amount of the front face and the reverse face was about 100° C. The heating and cooling were switched at a cycle of heating/cooling=15 s/15 s.

Figure 13:
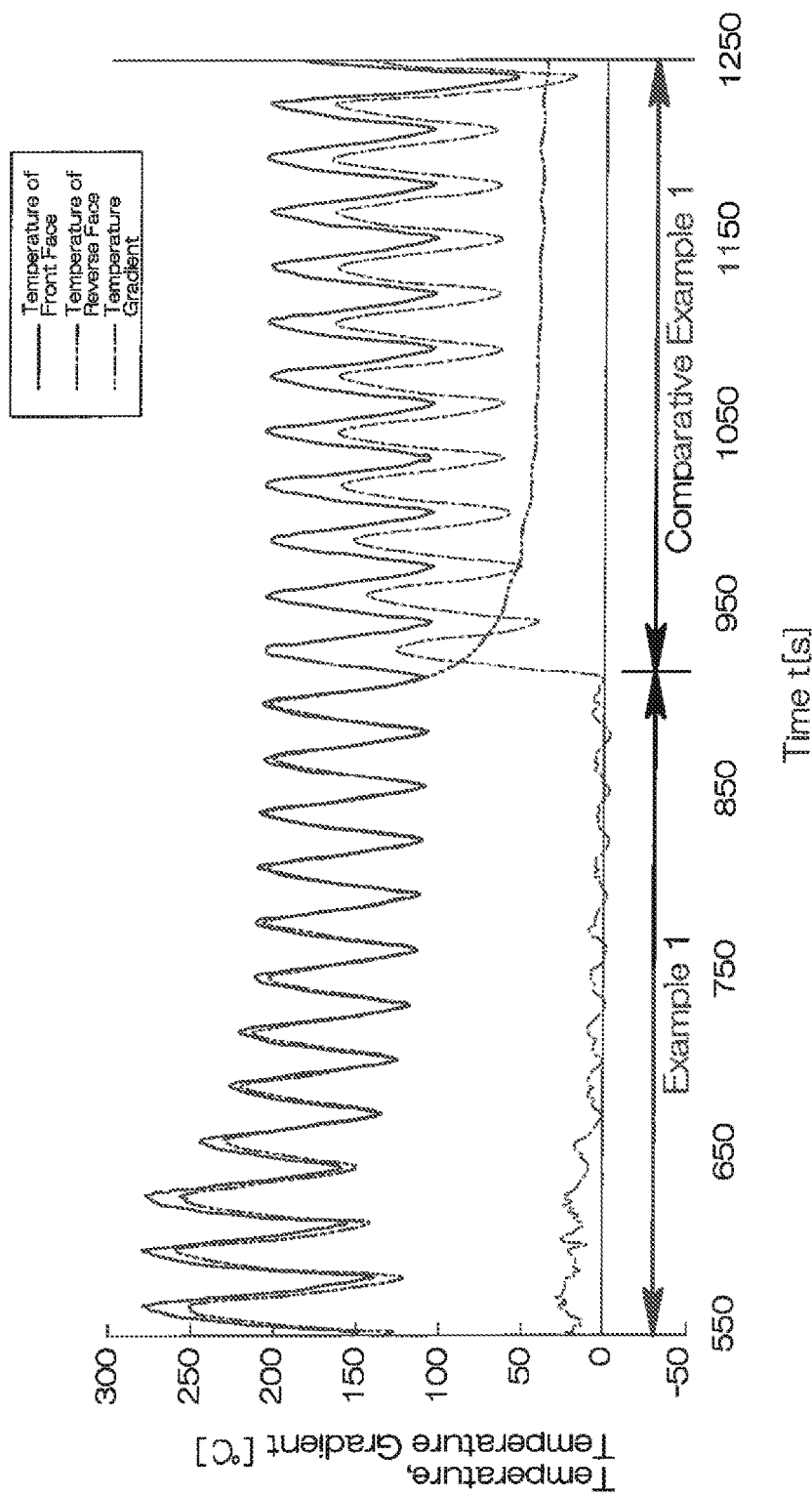
FIG. 13 is a graph showing temperature conditions in Example 1 and Comparative Example 1.
Figure 14:
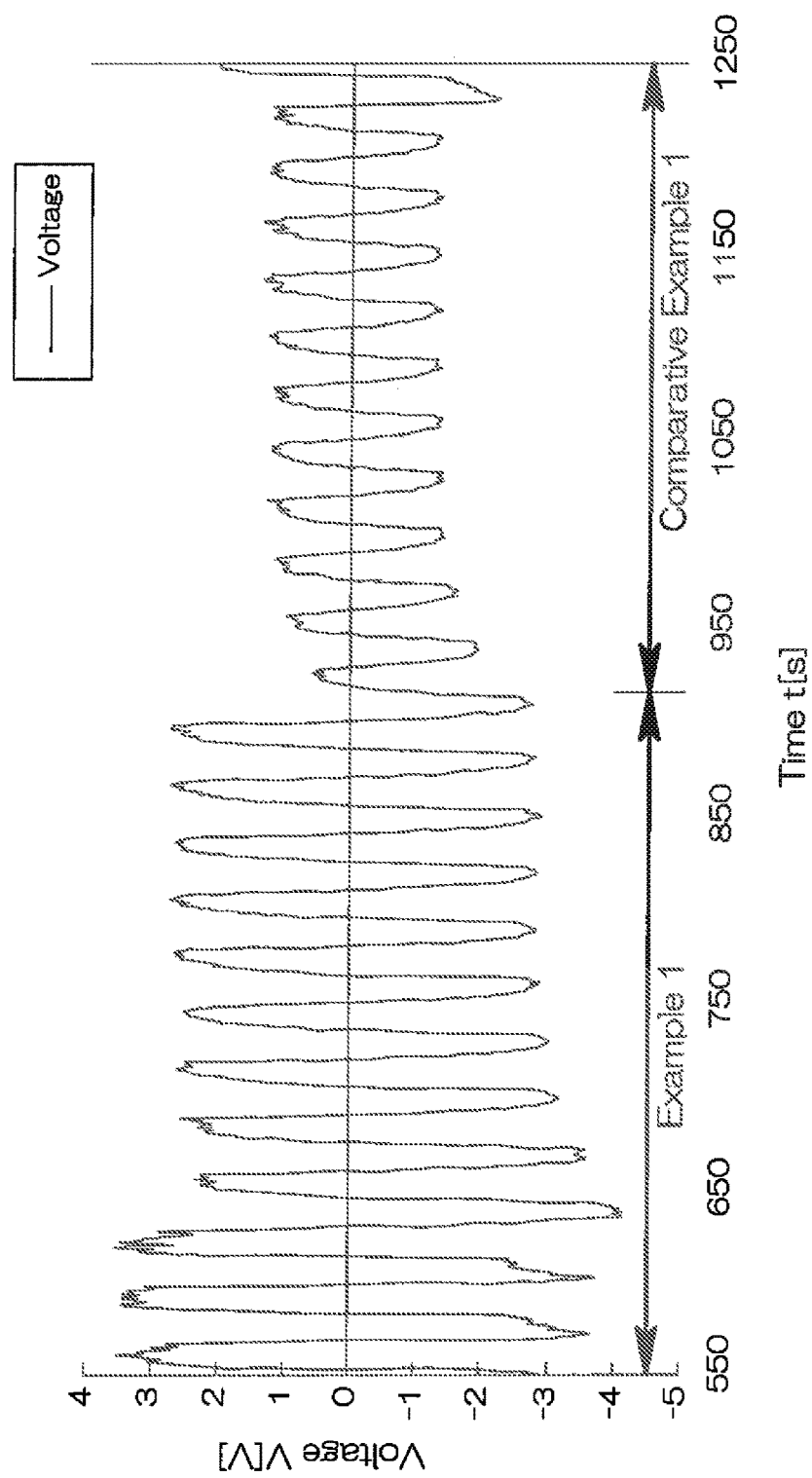
FIG. 14 is a graph showing generated voltage obtained in Example 1 and Comparative Example 1.

Then, the voltage change of the net generating power taken out from the piezoelectric element was observed with the voltmeter. The temperature conditions are shown in FIG. 13, and the generated voltage is shown in FIG. 14.

Comparative Example 1

Subsequently from Example 1, the temperature of the piezoelectric element was allowed to change over time and polarization was caused, and the generated voltage (net generating power) was taken out via the electrode and the lead wire, but the hot air was not blown to the reverse face of the piezoelectric element from the heat gun.

The temperature of the piezoelectric element was measured with an infrared thermometer, and the hot air temperature was adjusted so that the temperature of the front face was in the range of 100 to 250° C., the temperature of the reverse face was about 50° C., and the temperature difference between the front face and the reverse face was about 100° C., and that the temperature change amount of the front face was about 100° C. The heating and cooling were switched at a cycle of heating/cooling=15 s/15 s.

Then, the voltage change of the net generating power taken out from the piezoelectric element was observed with the voltmeter. The temperature conditions are shown in FIG. 13, and the generated voltage is shown in FIG. 14.

(Examination)

It was confirmed that efficient power generation can be achieved with the sample of Example 1, in which the front face and the reverse face (that is, 91.2% of the total surface area) of the piezoelectric element were heated and cooled, compared with the sample of Comparative Example 1, in which only the front face (that is, 45.6% of the total surface area) was heated and cooled.

Example 2

A bulk piezoelectric element (composition: Nb and Sn added PZT(Nb/Sn/Pb(Zr,Ti)$O_3$), Curie temperature 315° C., relative dielectric constant: about 2500, product number: H5C, Manufactured by Sumitomo Metal (SMI) Electronics Devices Inc.) was cut into a sheet having a size of 25 mm×25 mm×1.2 mm.

Then, a cut was formed at the side face of the piezoelectric element at a position of about a half in the thickness direction (about 0.6 mm from one face), and a silver paste for forming the second electrode (internal electrode) was injected in the cut. Also, a silver paste for forming a first electrode (external electrode) was applied so as to cover the both surfaces and the peripheral side faces (but excluding the side face where the cut was formed) of the piezoelectric element, and thereafter, heat-treated in an electric furnace at 300° C. for 1 hour.

In this manner, a sample including the first electrode and the second electrode was produced.

Thereafter, two lead wires (leads) were prepared, and one side of the two lead wires was attached onto the silver electrodes, and the other side thereof was connected to a digital multimeter. The produced sample was disposed in a stainless steel-made pipe.

A heat gun was used as the heat source, and the heat gun and the sample were positioned so that the jet was directed to the base of the first electrode of the sample and the jet was distant from the sample by 5 cm.

To block the hot air from the heat gun periodically, a propeller was disposed between the heat gun and the pipe in which the sample was disposed.

Then, by blowing the hot air from the heat gun and revolving the propeller, the hot air from the heat gun was applied periodically to the sample, the temperature of the sample was allowed to change over time and polarization was caused, and the generated voltage (net generating power) was taken out via the electrode and the lead wire.

Figure 15:
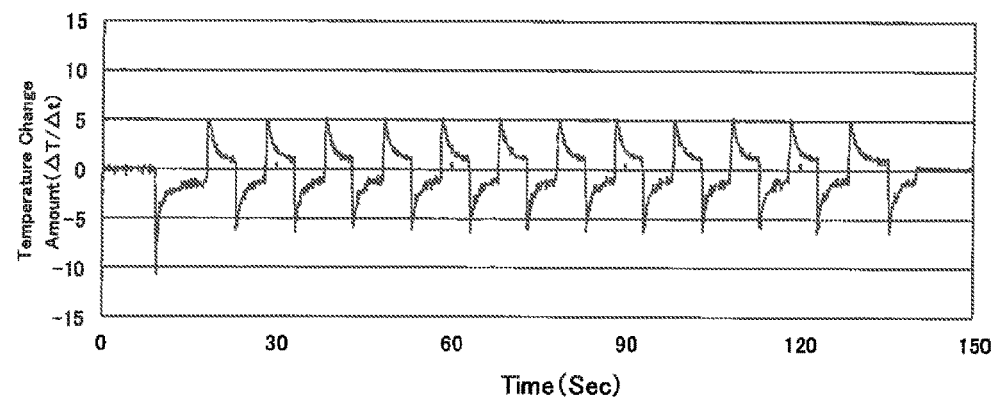
FIG. 15 is a graph showing temperature conditions in Example 2.
Figure 16:
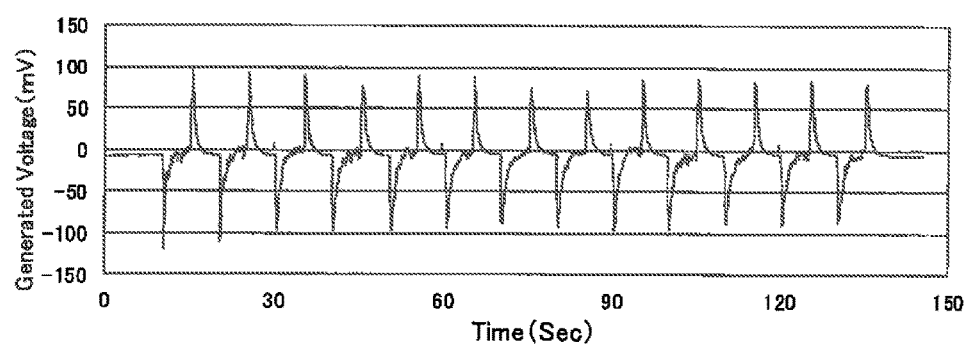
FIG. 16 is a graph showing generated voltage obtained in Example 2.

The temperature of the piezoelectric element was measured with an infrared thermometer. Then, the voltage change of the net generating power taken out from the sample was observed with the voltmeter. The temperature conditions are shown in FIG. 15, and the generated voltage is shown in FIG. 16.

Comparative Example 2

A bulk piezoelectric element (composition: Nb and Sn added PZT(Nb/Sn/Pb(Zr,Ti)$O_3$), Curie temperature 315° C., relative dielectric constant: about 2500, product number: H5C, Manufactured by Sumitomo Metal (SMI) Electronics Devices Inc.) was cut into a sheet having a size of 25 mm×25 mm×1.2 mm.

Then, a silver paste was applied on both sides of the piezoelectric element to give a size of 20 mm×20 mm×0.1 mm, and the piezoelectric element with the silver paste applied was heat-treated in an electric furnace at 300° C. for 1 hour.

In this manner, a sample including only two outer electrodes provided individually and not connected with the above-described base was produced.

Thereafter, two lead wires (lead) were prepared, and one side of the two lead wires was attached onto the silver electrodes, and the other side thereof was connected to a digital multimeter. The produced sample was disposed in a stainless steel-made pipe.

Then, in the same manner as in Example 1, the temperature of the sample was allowed to change over time and polarization was caused, and the generated voltage (net generating power) was taken out via the electrode and the lead wire.

Figure 17:
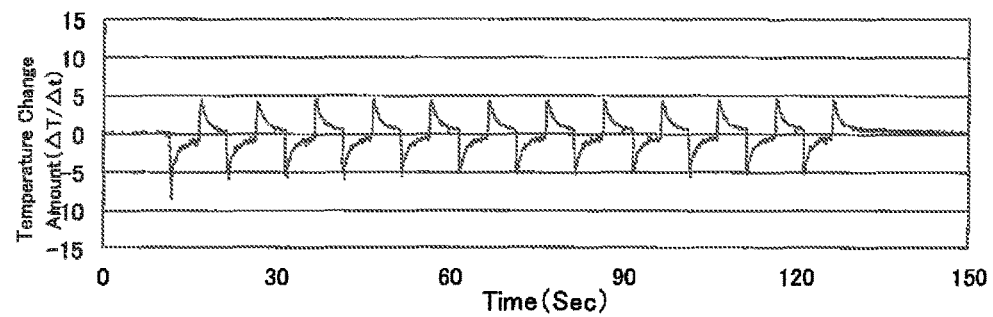
FIG. 17 is a graph showing temperature conditions in Comparative Example 2.
Figure 18:
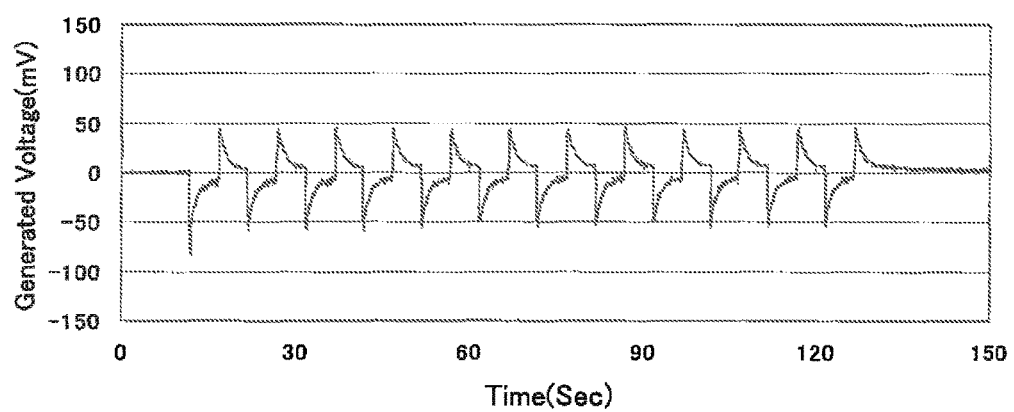
FIG. 18 is a graph showing generated voltage obtained in Comparative Example 2.

The temperature of the piezoelectric element was measured with an infrared thermometer. Then, the voltage change of the net generating power taken out from the sample was observed with the voltmeter. The temperature conditions are shown in FIG. 17, and the generated voltage is shown in FIG. 18.

(Examination)

It was confirmed that efficient power generation was achieved with the sample of Example 2, in which the sample including the outer electrode and the inner electrode was used, compared with the sample of Comparative Example 2, in which the sample having only the outer electrode was used.

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

A power-generating system of the present invention is suitably used in various energy-using devices including a device such as internal combustion engines including an automobiles engine, a heat exchanger including a boiler, and air-conditioning equipment, motor generators including a power generator and a motor, and a luminous device including lightings.

The invention claimed is:
1. A power-generating system comprising:
a heat source which is able to produce temporal temperature variation,
a first device in which polarization occurs based on the temperature change of the heat source, the first device being a sheet, and both of a front face and a reverse face of the first device being in contact with a heating medium that conducts heat of the heat source, and
a second device for taking out a net generating power from the first device,
wherein 80% or higher of the total surface area of the first device is heated and/or cooled by a heating medium generated from the heat source.
2. The power-generating system according to claim 1, wherein the first device undergoes polarization by the piezoelectric effect.
3. The power-generating system according to claim 1, wherein the first device undergoes polarization by the pyroelectric effect.
4. A power-generating system comprising:
a heat source which is able to produce temporal temperature variation,
a plurality of first devices in which polarization occurs based on the temperature change of the heat source, and
a plurality of second devices for taking out net generating power from the first devices, wherein 80% or higher of the total surface area of a laminate in which the first devices and the second devices are alternately laminated is heated and/or cooled by a heating medium generated from the heat source.

5. The power-generating system according to claim 4, wherein the heat source is an internal combustion engine.

6. The power-generating system according to claim 4, wherein the first device undergoes polarization by the piezoelectric effect.

7. The power-generating system according to claim 4, wherein the first device undergoes polarization by the pyroelectric effect.

8. The power-generating system according to claim 4, wherein the second device comprises a first electrode and a second electrode having different polarities from each other, the first electrode comprises two outer electrodes that are disposed to face each other so as to sandwich the first device from outside and are electrically connected to each other, and the second electrode comprises an inner electrode disposed between the two outer electrodes in the first device.

9. The power-generating system according to claim 8, wherein the first electrode further comprises at least one inner electrode electrically connected to the outer electrode and disposed in the first device between the two outer electrodes, the second electrode comprises a plurality of inner electrodes that are electrically connected to each other, and in the first device, the inner electrode of the first electrode and the inner electrodes of the second electrode are alternately disposed.

\* \* \* \* \*